United States Patent
Beck et al.

(10) Patent No.: US 10,551,465 B2
(45) Date of Patent: Feb. 4, 2020

(54) MAGNETIC RESONANCE IMAGING METHOD AND APPARATUS WITH SIMULTANEOUS IMAGE ACQUISITION OF MULTIPLE SUB-VOLUMES WITH SYNCHRONOUS ACQUISITION OF NAVIGATORS

(71) Applicant: Siemens Healthcare GmbH, Erlangen (DE)

(72) Inventors: Thomas Beck, Erlangen (DE); Thorsten Feiweier, Poxdorf (DE)

(73) Assignee: Siemens Healthcare GmbH, Erlangen (DE)

( * ) Notice: Subject to any disclaimer, the term of this patent is extended or adjusted under 35 U.S.C. 154(b) by 370 days.

(21) Appl. No.: 15/356,108

(22) Filed: Nov. 18, 2016

(65) Prior Publication Data
US 2017/0146631 A1 May 25, 2017

(30) Foreign Application Priority Data
Nov. 19, 2015 (DE) .......................... 10 2015 222 835

(51) Int. Cl.
*G01R 33/565* (2006.01)
*G01R 33/483* (2006.01)
*G01R 33/56* (2006.01)

(52) U.S. Cl.
CPC ... *G01R 33/56509* (2013.01); *G01R 33/4833* (2013.01); *G01R 33/5608* (2013.01)

(58) Field of Classification Search
CPC .............. G01R 33/4818; G01R 33/482; G01R 33/4824; G01R 33/4833; G01R 33/5611; G01R 33/5613; G01R 33/5616; G01R 33/56509; G01R 33/5676; G01R 33/5608
See application file for complete search history.

(56) References Cited

U.S. PATENT DOCUMENTS

| | | | | |
|---|---|---|---|---|
| 5,938,600 | A * | 8/1999 | Van Vaals ................ | A61N 7/02 324/306 |
| 6,064,206 | A * | 5/2000 | Van Vaals .......... | G01R 33/4804 324/309 |
| 6,184,682 | B1 * | 2/2001 | Ehman .................... | G06T 5/003 324/300 |

(Continued)

OTHER PUBLICATIONS

Thesen et al: "Prospective Acquisition Correction for Head Motion With Image-Based Tracking for Real-Time fMRI" Magnetic Resonance in Medicine 44, pp. 457-465 (2000).

(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

In a magnetic resonance imaging apparatus and a method for generating magnetic resonance image data of a field of view of an examination object, magnetic resonance raw data are acquired by preferably different transverse magnetizations being excited in at least one sub-volume of a navigator volume and at least one sub-volume of an image volume, and are used for position determination and for imaging. These preferably different transverse magnetizations are simultaneously present in at least one period of the scan.

24 Claims, 9 Drawing Sheets

(56) References Cited

U.S. PATENT DOCUMENTS

| | | | | |
|---|---|---|---|---|
| 6,516,210 B1* | 2/2003 | Foxall | | G01R 33/5676 |
| | | | | 324/307 |
| 6,842,000 B2* | 1/2005 | Norris | | G01R 33/56509 |
| | | | | 324/309 |
| 9,316,713 B2* | 4/2016 | Iwadate | | G01R 33/5676 |
| 2002/0180436 A1* | 12/2002 | Dale | | G01R 33/56509 |
| | | | | 324/307 |
| 2005/0237057 A1* | 10/2005 | Porter | | G01R 33/56341 |
| | | | | 324/307 |
| 2006/0164087 A1* | 7/2006 | Smink | | G01R 33/5676 |
| | | | | 324/309 |
| 2007/0001674 A1* | 1/2007 | Purdy | | G01R 33/5676 |
| | | | | 324/309 |
| 2008/0123921 A1* | 5/2008 | Gielen | | A61B 5/1127 |
| | | | | 382/131 |
| 2009/0066329 A1* | 3/2009 | Kanda | | G01R 33/5676 |
| | | | | 324/309 |
| 2009/0259120 A1* | 10/2009 | Iwadate | | A61B 5/055 |
| | | | | 600/410 |
| 2010/0022874 A1* | 1/2010 | Wang | | A61B 34/20 |
| | | | | 600/427 |
| 2010/0171497 A1* | 7/2010 | Iwadate | | G01R 33/5676 |
| | | | | 324/309 |
| 2011/0038520 A1* | 2/2011 | Yui | | G01R 33/5676 |
| | | | | 382/131 |
| 2012/0093384 A1* | 4/2012 | Goto | | G01R 33/543 |
| | | | | 382/131 |
| 2012/0249138 A1* | 10/2012 | Pfeuffer | | G01R 33/56563 |
| | | | | 324/309 |
| 2013/0030408 A1* | 1/2013 | Piferi | | A61B 5/055 |
| | | | | 604/500 |
| 2013/0060126 A1* | 3/2013 | Greiser | | A61B 5/055 |
| | | | | 600/410 |
| 2013/0127460 A1* | 5/2013 | Beck | | G01N 24/08 |
| | | | | 324/309 |
| 2013/0211236 A1* | 8/2013 | Beck | | G01R 33/5673 |
| | | | | 600/413 |
| 2013/0278263 A1* | 10/2013 | Huang | | G01R 33/5611 |
| | | | | 324/309 |
| 2013/0285656 A1* | 10/2013 | Feiweier | | G01R 33/56 |
| | | | | 324/309 |
| 2013/0342206 A1 | 12/2013 | Ugurbil | | |
| 2014/0266195 A1* | 9/2014 | Levin | | G01R 33/56509 |
| | | | | 324/309 |
| 2015/0084627 A1 | 3/2015 | Ruhm et al. | | |
| 2015/0084629 A1 | 3/2015 | Porter | | |
| 2015/0302297 A1 | 10/2015 | Griswold et al. | | |
| 2015/0323637 A1* | 11/2015 | Beck | | G01R 33/4828 |
| | | | | 600/410 |
| 2016/0202339 A1* | 7/2016 | Zhang | | G01R 33/56509 |
| | | | | 324/309 |
| 2016/0252596 A1* | 9/2016 | Nielsen | | G01R 33/482 |
| | | | | 324/309 |
| 2016/0313433 A1* | 10/2016 | Beck | | G01R 33/56509 |
| 2017/0038448 A1* | 2/2017 | Beck | | G01R 33/4835 |
| 2017/0089999 A1* | 3/2017 | Zeller | | G01R 33/56563 |
| 2017/0219674 A1* | 8/2017 | Van Der Kouwe | | |
| | | | | G01R 33/5613 |
| 2018/0217220 A1* | 8/2018 | Gulani | | G01R 33/5659 |

OTHER PUBLICATIONS

Bhat et. al.: "Motion Insensitive ACS Acquisition Method for in-plane and Simultaneous Multi-Slice Accelerated EPI"; Proc. Intl. Soc. Mag. Reson. Med.; vol. 22; p. 0644 (2014).

Breuer et. al.: "Controlled Aliasing in Parallel Imaging Results in Higher Acceleration (CAIPIRINHA) for Multi-Slice Imaging", in: Magnetic Resonance in Medicine, vol. 53, No. 3, pp. 684-691 (2005).

Larkman et al., "Use of Multicoil Arrays for Separation of Signal from Multiple Slices Simultaneously Excited", in: Journal of Magnetic Resonance Imaging; vol. 13; pp. 313-317 (2001).

Tisdall et al. :"MPRAGE Using EPI Navigators for Prospective Motion Correction", Proc. Intl. Soc. Mag. Reson. Med. 17, p. 4656, (2009).

Griswold et al., Generalized Autocalibrating Partially Parallel Acquisitions (GRAPPA); Magnetic Resonance in Medicine, 47, p. 1202, (2002).

Stäb, et al. "CAIPIRINHA Accelerated SSFP Imaging", in: Magnetic Resonance in Medicine, vol. 65, pp. 157-164, (2011).

Souza et al: "SIMA: Simultaneous Multislice Acquisition of MR Images by Hadamard-Encoded Excitation", in: Journal of Computer Assisted Tomography vol. 12, No. 6, pp. 1026-1030, (1988).

Thesen:"Retrospektive and prospektive Verfahren zur bildbasierten Korrektur von Patientenkopfbewegungen bei neurofunktioneller Magnetresonanztomographie in Echtzeit", Doktorarbeit Universität Heidelberg, pp. 1-42, (2001).

Giese et al; "Multi-slice Free Breathing Liver Imaging using a 20 CAIPIRINHA Navigator"; Proceedings of the International Society for Magnetic Resonance in Medicine vol. 21; p. 0307;( 2013).

Celicanin et al; "Simultaneous Acquisition of Image and Navigator Slices Using CAIPIRINHA for 40 MRI"; Magnetic Resonance in Medicine (2015); vol. 73; pp. 669-676;; (2015).

Celicanin et al; "Simultaneous Acquisition of Image and Navigator Slices Using CAIPIRINHA"; Proceedings of the International Society for Magnetic Resonance in Medicine, vol. 19; p. 4399; (2011).

* cited by examiner

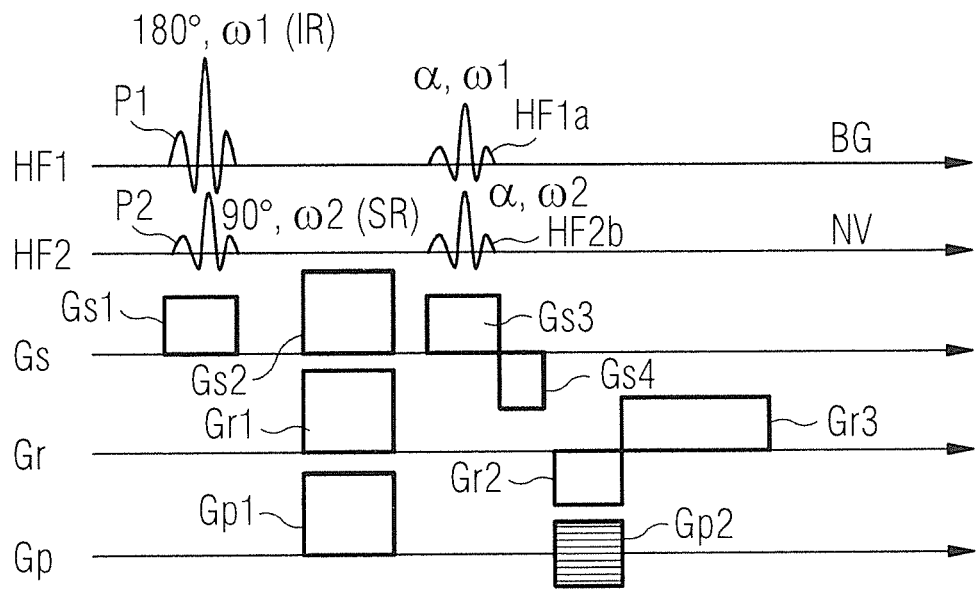
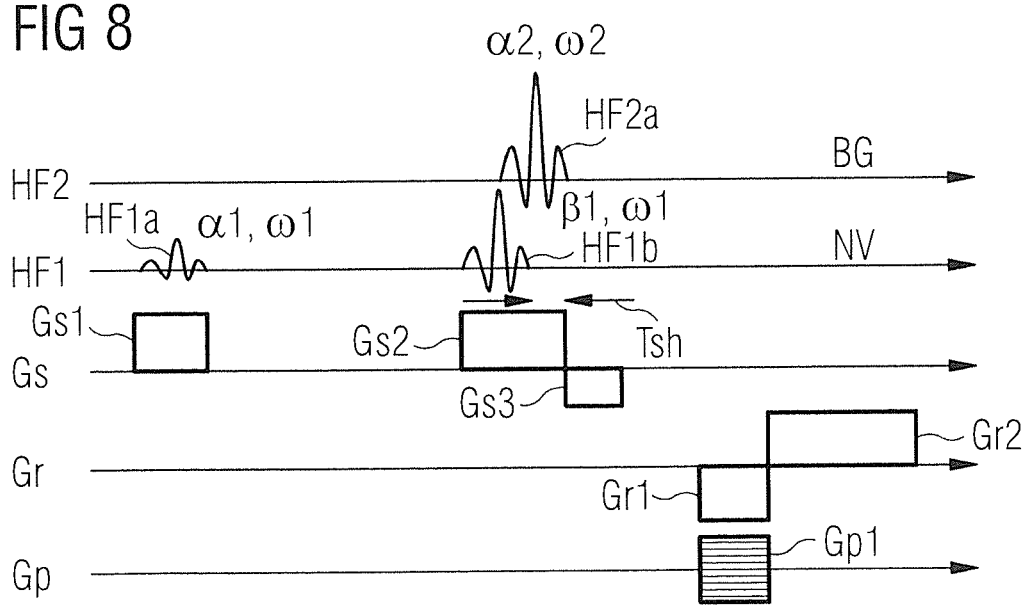

MAGNETIC RESONANCE IMAGING METHOD AND APPARATUS WITH SIMULTANEOUS IMAGE ACQUISITION OF MULTIPLE SUB-VOLUMES WITH SYNCHRONOUS ACQUISITION OF NAVIGATORS

BACKGROUND OF THE INVENTION

Field of the Invention

The invention concerns a method for controlling a magnetic resonance imaging apparatus as well as a control sequence-determining computer and a magnetic resonance imaging apparatus that implement such a method.

Description of the Prior Art

In medicine two-dimensional or three-dimensional image data as well as a time series of image data are often generated, using modern imaging methods, and such data are used for visualizing a mapped examination object. These imaging methods are also used for applications outside of medicine. Such imaging methods include, inter alia, magnetic resonance imaging, also called magnetic resonance tomography.

In magnetic resonance tomography, a static basic magnetic field Bo, for initial orientation and homogenization of magnetic dipoles to be examined, is usually overlaid with a rapidly-switched magnetic field, known as the gradient field, for spatial resolution of the imaging signal. In order to determine material properties of an examination object to be mapped, the dephasing or relaxation time is ascertained following a displacement of the magnetization from the initial orientation, so different relaxation mechanisms or relaxation times typical for the material can be identified. The displacement usually occurs due to a number of RF pulses, and the spatial resolution is based on a manipulation of the displaced magnetization, defined in terms of time, with the use of the gradient field in what is known as a scan sequence or control sequence. Such a scanner or control sequence defines an exact sequence over time of RF pulses, changes in the gradient field (due to emission of a switching sequence of gradient pulses) and the acquisition of scan (raw data) values. In addition to relaxation, there is also a range of further procedures for contrast imaging, such as, for example, flux measurement and diffusion imaging.

Typically there is an association between scanned magnetization—from which the material properties can be derived—and a coordinate of the scanned magnetization in the space in which the examination object is arranged, with the use of an intermediate step. In this intermediate step acquired magnetic resonance raw data are entered at respective readout points in a memory. The collection of such data in the memory is known as "k-space", and the coordinates of data in k-space are coded as a function of the gradient field. The value of magnetization (in particular the transverse magnetization, determined in a plane transverse to the above-described basic magnetic field) at a specific location of the examination object can be ascertained from k-space data with the use of a Fourier transformation. In other words, k-space data (magnitude and phase) are needed in order to calculate a signal strength of the signal, and optionally its phase, in the position space (spatial domain).

Magnetic resonance tomography is a relatively slow type of imaging because the data are sequentially recorded along trajectories, such as, for example lines or spirals, in Fourier space (k-space). The method of recording images in two-dimensional slices is much less prone to errors compared to recording in three dimensions, because the number of coding steps is smaller than with a three-dimensional method. In many applications therefore, image volumes with stacks of two-dimensional slices are used instead of a single three-dimensional recording. However, the image recording times are very long due to the long relaxation times of the spins, and this entails a reduction in comfort of the patient being examined.

With a different type of scanning, selectively excited sub-volumes, known as "slabs", are spatially encoded with the use of a three-dimensional scanning method.

In the case of a movement of the patient, the consistency of the scanned data is lost with the described imaging methods, and this is reflected by image artifacts in the reconstructed image. For this reason, it is desirable to compensate the movement of the patient. This is done either retrospectively (after the scan) or prospectively (as early as during the scan).

Methods of prospective movement correction correct the movement of the patient as early as during the performance of the scan. This occurs, for example by the field of view (FoV), which represents the section of the anatomy to be acquired, being tracked during the scan such that the anatomy contained therein does not change despite movement. A large number of methods exist in order to achieve this. For example, external systems, in particular cameras, are used for monitoring the position of the examination object. Monitoring can also be implemented with the use of markers that are visible to (detectable by the magnetic resonance scanner. Characteristic anatomical structures (landmarks) can also be observed instead of markers when monitoring. Furthermore, additional image-based navigators are also used to detect a change in the position of the examination object and to track the field of view accordingly. In the case of time-resolved image data, the image data itself can also be used for detecting a change in position; an additional acquisition of image-based navigators can optionally be omitted in this case therefore.

When using image-based navigators, the imaging MR sequence is used to depict the anatomy in navigator images at successive instants. A reference volume is typically scanned at the beginning of the scan and subsequent navigator images are registered at this reference time. The detected movement is then returned to the MR pulse sequence and the field of view or the image region is tracked by this movement for the next partial acquisition, and the movement is thereby compensated as early as during the scan.

A slice-based acceleration technology has become established in recent years to accelerate the image recording, or to accelerate the required scan duration for acquisition of an individual image volume. Using this technology known by the names "Simultaneous Multi-Slice" (abbreviated to SMS or SAMS), "Slice Acceleration" or even "Multiband", multiple slices are simultaneously excited and read out (as described e.g. Breuer et al. Magnetic Resonance in Medicine 53:684 (2005), Souza et al. Journal of Computer Assisted Tomography 12:1026 (1988), Larkman et al. Journal of Magnetic Resonance Imaging 13:313 (2001). For example, with an acceleration factor of three, three slices respectively are simultaneously excited and read out. This reduces the required repetition time TR (the time until successive pulse sequences are applied to the same slice) to one third of the required time. Accordingly, the time necessary for acquisition of a volume can be reduced to a third of the required time, for example in the case of functional imaging (fMRI, BOLD) or diffusion imaging by echo-planar recording. The reduction in the scan time and the improvement in the scan rate in terms of time are cited as the main advantage of these methods in the literature.

Even when scanning selectively excited sub-volumes, it is possible to scan a number of sub-volumes simultaneously with the use of "multi-slab" imaging in order to accelerate the recording process. A procedure of this kind can be regarded as an intermediate stage between 2D-multi-slice imaging and complete 3D imaging.

Conventional methods for movement correction can be divided into two groups. The first group includes methods in which the image data generated directly by the MR pulse sequence is used for determining the movement. These methods are used for sequences that generate a 4D time series which contains the identical anatomy in each case. One example of this is functional, echo-planar imaging as proposed in Thesen, Magnetic Resonance in Medicine 44.3: 457, and in a dissertation by Thesen "Retrospektive and prospektive Verfahren zur bildbasierten Korrektur von Patientenkopfbewegungen bei neurofunktioneller Magnetresonanztomographie in Echtzeit" (2001) Retrospective and prospective methods for image-base correction of patient head movements in neurofunctional magnetic resonance tomography in real time.

The second group includes methods with which the MR pulse sequence is changed such that, in addition to the intended MR image data, navigator images are also generated. The navigator images are then used to compensate the patient movement after or even during the scan.

The two outlined approaches for prospective or retrospective movement correction both have specific drawbacks. For the first group of methods, only the exactly identical image data is available for movement correction. This can be disadvantageous, for example, if the image contrast or the noise behavior is not suitable for movement detection. In addition, it is possible that the mapped anatomy is not suitable for the chosen method of movement correction. This is the case, for example, for the assumption of a rigid movement model if non-rigid movable parts of the anatomy are mapped (e.g. the movement of the eyeballs or of the jaw when scanning the head) or the contained structures of specific, non-rigid artifacts are affected (e.g. non-rigid distortions due to inhomogeneities of the magnetic field).

The second group of methods requires an additional scan of an image-based navigator. With some sequences this can be inserted in unused periods of the sequence. Tisdall et al. "International Society for Magnetic Resonance Medicine 2009, "MPRAGE using EPI navigators for prospective motion correction" propose this approach in order to insert an additional 3D-EPI navigator in the inversion time in an MPRAGE sequence. In general, however, this is not possible for all sequences without changing the time response, in particular it is not possible for those sequences that do not have the unused periods necessary for this.

An additional drawback of the described methods (in particular of the second group) is that the recording of the navigator image and the acquisition of the MR signal for imaging take place with at slightly staggered intervals. Even for the case where the movement of the navigator can be exactly detected and be compensated by the sequence, resulting artifacts remain in the MR data because the movement content between the time of acquisition of the navigator and the time of acquisition of the desired MR imaging signal is not detected and therefore cannot be compensated either.

A further problem is that the navigator images, if they are acquired using an MR pulse sequence that differs from the MR imaging sequence, can have different image artifacts, such as distortions. If these artifacts are offset by the movement detection and compensation, artifacts can be generated in the MR imaging sequence that, without correction, would not be included at all.

SUMMARY OF THE INVENTION

An object of the present invention is to provide a method for controlling a magnetic resonance imaging apparatus with which improved movement correction is possible, and wherein at least some of the aforementioned problems with conventional movement correction methods are solved or at least reduced.

In the inventive method for controlling a magnetic resonance imaging apparatus for generating magnetic resonance image data of a field of view of an examination object, magnetic resonance raw data are acquired. Preferably different transverse magnetizations in at least one sub-volume of a navigator volume, and in at least one sub-volume of an image volume, are excited and used for position determination and imaging. These preferably different transverse magnetizations are simultaneously present in at least one period (portion) of the scan. As used herein, navigator volumes mean one or more image region(s) that are not used directly for image recording, but are used for recording reference data with which movement corrections can be made in the simultaneously recorded image data. The navigator volume can be part of the image volume; it can also overlap therewith or be separate therefrom. The term image volume means the region of an examination object to be mapped during the course of an image recording. Transverse magnetization means a magnetization that is oriented in the transverse direction to the basic magnetic field. The transverse magnetizations of the different sub-volumes are preferably different, but can also be the same. Sub-volumes can slices or even the sub-volumes called "slabs" above.

With the inventive method, the image volume and the navigator volume are recorded simultaneously. The simultaneously recorded navigator data can therefore be used for movement correction of the image data. Since the navigator data are acquired at exactly the same time as the image data, the movement correction of the image data can occur much more precisely than with conventional methods in which the navigator data and image data are acquired at staggered intervals. Improved image quality is therefore achieved in the image recording of dynamic processes with the inventive method. The acquisition of the navigator data and image data is preferably performed with different transverse magnetizations, but is not limited thereto. Different contrast properties of imaging are connected with these different transverse magnetizations. The contrast properties of the navigator image and the actual image recording thus can be chosen so as to be different. For example, the contrast of the navigator image can be chosen to be much weaker because the requirements on the level of detail of the navigator image are lower. This procedure has the advantage that a lower SAR exposure and a lower RF peak output accompany the weaker contrast of the navigator image, so the exposure of a patient and the stress on the apparatus used can turn out to be lower.

The inventive control sequence for controlling a magnetic resonance imaging system has at least one pulse sequence section that has an excitation portion and a subsequent readout portion.

The excitation portion has the following pulse arrangement:

a slice selection gradient pulse in the slice selection direction, and a number of RF excitation pulses for influencing at least one navigator sub-volume and at least one sub-volume of an image volume to be mapped at the same time as the at least one navigator sub-volume.

The sub-volumes are preferably influenced such that the magnetization state of the at least one navigator sub-volume and of the at least one sub-volume of the image volume, influenced by a further imaging parameter, which does not relate to the selection of the navigator slice and the image volume slice, differ.

In general, a slice selection gradient means a gradient magnetic field with which a magnetic field that is location-dependent in one direction is superimposed on individual sub-volumes or even slices. In connection with the inventive control sequence, a slice selection gradient means a gradient magnetic field that allocates different magnetic field strengths to different stacks or groups of slices or groups of sub-volumes. Thus, for example, an RF excitation pulse emitted at the same time as the slice selection gradient pulse acts only on the selected slice stack or the selected slice group or the selected group of sub-volumes. The slice selection gradient preferably acts as a shared slice selection gradient for the navigator sub-volume to be mapped and the sub-volume of an image volume to be mapped simultaneously thereby.

The selection of the imaging parameters relating to individual slices means the excitation frequency or the relative phase with which the relevant slices are excited. The magnetization states of the at least one navigator sub-volume and of the at least one sub-volume of the image volume are preferably influenced by additional imaging parameters that are not used directly for slice selection.

The subsequent readout portion has a readout window for reading out RF signals for the acquisition of magnetic resonance raw data.

"Further imaging parameters" mean variables that influence the image contrast of the MR image recordings. In addition, the pulse sequence section can also have a number of gradient pulses in the slice selection direction. In this sense the term "a slice selection gradient pulse" using the indefinite article is not intended to be limiting. A pulse sequence should, as is customary in magnetic resonance tomography, be taken to mean a sequence of radio-frequency pulses and magnetic field gradient switchings with different strengths and duration with which a nuclear spin resonance signal is generated. A pulse sequence section should be taken to mean a portion of the pulse sequence that is repeated several times in terms of the basic conception, wherein changes, for example with respect to the gradient switchings, can be made with each repetition.

The inventive control sequence-determining computer is designed to determine the inventive control sequence for a magnetic resonance imaging apparatus. The control sequence-determining computer can be, for example, part of a control computer of the magnetic resonance imaging system.

The inventive magnetic resonance imaging apparatus has a control computer designed to control the magnetic resonance imaging apparatus using the inventive method. The control computer preferably includes the inventive control sequence-determining computer. The inventive control sequence-determining system can also be accommodated in the magnetic resonance imaging apparatus outside of the control computer as a separate component.

The basic components of the inventive computer can be designed for the most part in the form of software components. This relates, in particular, to the control computer of the magnetic resonance imaging apparatus and the control sequence-determining computer. These components can, however, also be implemented partly in the form of software-supported hardware, for example FPGAs or the like, in particular when particularly quick calculations are involved. The required interfaces can similarly be designed, for example when it is merely a matter of taking over data from other software components, as software interfaces. They can also be designed as interfaces constructed in terms of hardware, which are controlled by appropriate software.

The inventive control sequence-determining computer can be part of a user terminal or a controller of the MR apparatus.

An implementation largely in terms of software has the advantage that previously used controllers can be easily upgraded by a software update in order to operate inventively. In this regard, the above object is also achieved by a non-transitory, computer-readable data storage medium encoded with computer code, which can be loaded directly into a memory of a control computer of a magnetic resonance tomography apparatus. The program code causes all steps of the inventive method to be implemented when the program is run in the control computer. In addition, the computer can optionally have additional components, such as documentation procedures and/or hardware components, such as, e.g. hardware keys (dongles, etc.) for use of the software.

The computer-readable medium can be a memory stick, a hard disk or another transportable or permanently installed data carrier.

Each of the embodiments and developments of the invention described below for one aspect of the invention can be applied analogously to other aspects of the invention. Furthermore, within the scope of the invention the various features of different exemplary embodiments can be combined to form further exemplary embodiments.

In an embodiment of the inventive method, navigator image data acquired at the same time as image data are used for real-time position correction of the current field of view of the examination object. In other words, the navigator image data are used as information in respect of a movement of the recording region. This information is applied to the orientation of the image parts to be scanned in the future, so prospective movement compensation is achieved. The recording region thus can be tracked accordingly during image recording of a movement, so displacements and artifacts within an individual image recording and between successively recorded image data can be reduced.

The acquired navigator image data can alternatively or additionally be used for retrospective position correction of recorded image data. The simultaneously acquired navigator image data are used to correct the simultaneously acquired image data from the image volume with regard to artifacts due to movements of the image volume to be recorded. The quality of the image recordings can be improved further with supplementary application of a retrospective correction.

In a preferred embodiment of the inventive method, the number of sub-volumes, for example slices, of the navigator volume is less than the number of sub-volumes, in particular slices, of the image volume. In addition, image recording of the navigator volume can occur with a higher acceleration factor. Both measures lead to the navigator volume being scanned at a higher speed or more frequently than the image volume. If an image recording is made of a rapidly changing examination region, then this can be taken into account with an accelerated navigator recording in order to compensate or correct artifacts due to the high dynamics of the system during image recording. In other words, the movement of the object to be examined can be detected with significantly enhanced updating compared to conventional methods.

The acceleration factor designates how many slices are scanned simultaneously. A portion of the simultaneously scanned slices is used for imaging, another portion for navigator purposes. Faster scanning of the navigator region is provided if the quotient of the number of sub-volumes of the imaging volume and the acceleration factor for the imaging volume is greater than the quotient of the number of navigator sub-volumes and the acceleration factor for the image recording of the navigator sub-volumes.

Alternatively, the navigator volume can also be resolved higher than the image volume is scanned if, for example, robust three-dimensional movement detection is required for an imaging volume which is composed of a small number of slices.

A reference scan is preferably carried out in the inventive method when using a magnetic resonance imaging scanner having N coils (N>1) at least for some of the different simultaneously present transverse magnetizations of the navigator sub-volumes and sub-volumes of the image volume in each case. On the basis of the reference scans a calculation of convolution matrices is then made by a combination of the individual reference scans, with different convolution matrices being calculated for different spacings of sub-volumes or slice spacings. Mathematical features known as convolution kernels are calculated on the basis of the convolution matrices, the composition of which kernels changes with different spacings between the sub-volumes of the image volume and the navigator sub-volume, specifically the image volume slice and navigator slice. A change in the spacings of simultaneously scanned slices occurs, for example, with the variants having different scanning speeds of the image volume and the navigator volume. There is optionally also an adjustment of the calculation of the convolution kernels such that specific convolution kernels are calculated for at least some of the permutations of the target contrasts or sequence of sub-volumes.

In another embodiment of the inventive method, the navigator volume and the image volume form a non-empty intersection. For example, the image volume can encompass the entire navigator volume. With this variant the image volume can be partially or even completely covered by the navigator volume. The movements that occur in the navigator volume can be transferred directly to the image volume by the at least partial sameness of navigator volume and image volume. In other words, relative movements within the regions can also be taken into account in image correction, in particular in the case of non-rigid examination regions.

The navigator volume is preferably positioned along the slice normal on a side outside of the image volume. If the navigator volume is arranged outside of the image volume, the actual image recording is not influenced by the navigator image recording. In particular, there is no saturation of slices to be mapped due to the navigator image recording which could lead to contrast distortion in the actual image recording of the slice. The application of this variant functions particularly well and precisely when the examination object has the same movement behavior in the image volume and in the navigator volume.

In a further embodiment of the inventive method that can be applied particularly advantageously, the navigator volume is positioned along the slice normal on both sides outside of the image volume. Since the two navigator volumes are relatively far apart from each other, rotatory movement fractions, in particular, are detected more exactly or robustly with this variant. In addition, the second navigator volume may be used for checking the consistency of the ascertained movement of the examination region.

In another embodiment of the inventive method, more than two navigator volumes are acquired, and these are positioned along the slice normal at any predetermined position. This embodiment also includes any desired overlappings of navigator volumes and imaging volumes. One of the navigator volumes is preferably positioned closer to the image volume, viewed in the direction of the slice normal or direction of the slice selection gradient, than the second or the other navigator volume(s).

With these embodiments specific updating rates can be implemented for the respective navigator volumes. The navigator volumes can lie partially within, or outside of, the image region or image volume. A suitable acquisition sequence of the sub-volumes or slices should be observed, so a sub-volume of the navigator volume and a sub-volume of the image volume or, specifically, an imaging slice and a navigator slice are not simultaneously scanned at the same position or a position that is only slightly different.

In another embodiment of the inventive method, a pulse sequence having at least one pulse sequence section is generated for controlling the magnetic resonance imaging system. The at least one pulse sequence section has an excitation process (module) and a readout process (module). The excitation process includes the following steps:

generating a slice selection gradient pulse in the slice selection direction, generating the preferably different transverse magnetizations by generating a plurality of different RF excitation pulses for influencing at least one sub-volume of the navigator volume and at least one sub-volume of the image volume that is to be mapped at the same time as the sub-volume of the navigator volume such that the magnetization state of the at least one navigator sub-volume and the magnetization state of the at least one sub-volume of the image volume, influenced by a further imaging parameter relating to neither the excitation frequency nor the excitation phase, differ.

The RF excitation pulse associated with the at least one sub-volume of the navigator volume preferably differs with regard to an imaging parameter, relating preferably to neither the excitation frequency nor the excitation phase, from the RF excitation pulse associated with at least one sub-volume of the image volume. In other words, different contrasts are excited with the different RF excitation pulses in simultaneously excited sub-volumes of the image volume and navigator sub-volumes.

The subsequent readout process includes the following steps:

generating one or more readout gradient pulses for the sub-volumes to be mapped simultaneously and influenced by irradiation of the RF excitation pulses, receiving RF signals for the acquisition of magnetic resonance raw data.

The further differently chosen imaging parameters can be at least one of the following variables:

amplitude value,
amplitude characteristic,
phase characteristic,
number of excitation pulses,
start time and duration, sequence type.

Therefore quite different sequences can be activated simultaneously in addition to individual, simultaneously employed RF excitation pulses having different imaging parameters, with one of the sequences being used for excitation of a navigator slice and another sequence being used for excitation of an image volume slice.

With the inventive method, excitations with different flip angles can be generated, for example with the use of the differently chosen parameters, at least for some of the navigator sub-volumes and imaging sub-volumes that are to be mapped simultaneously. Requirements with regard to an image contrast and with regard to a maximum SAR exposure as well as an RF peak output can be coordinated with the use of the different flip angles. The synchronous SMS navigator concept thus may also be applied to image sequences whose SMS acceleration is possible to only a very limited extent due to SAR limitations, such as to spin echo sequences.

BRIEF DESCRIPTION OF THE DRAWINGS

FIG. 7 shows the course over time of a fifth SMS pulse sequence that can be used for an acquisition method corresponding to the scheme in FIG. 2.

FIG. 8 shows the course over time of a sixth SMS pulse sequence that can be used for an acquisition method corresponding to the scheme in FIG. 2.

DESCRIPTION OF THE PREFERRED EMBODIMENTS

Figure 1:
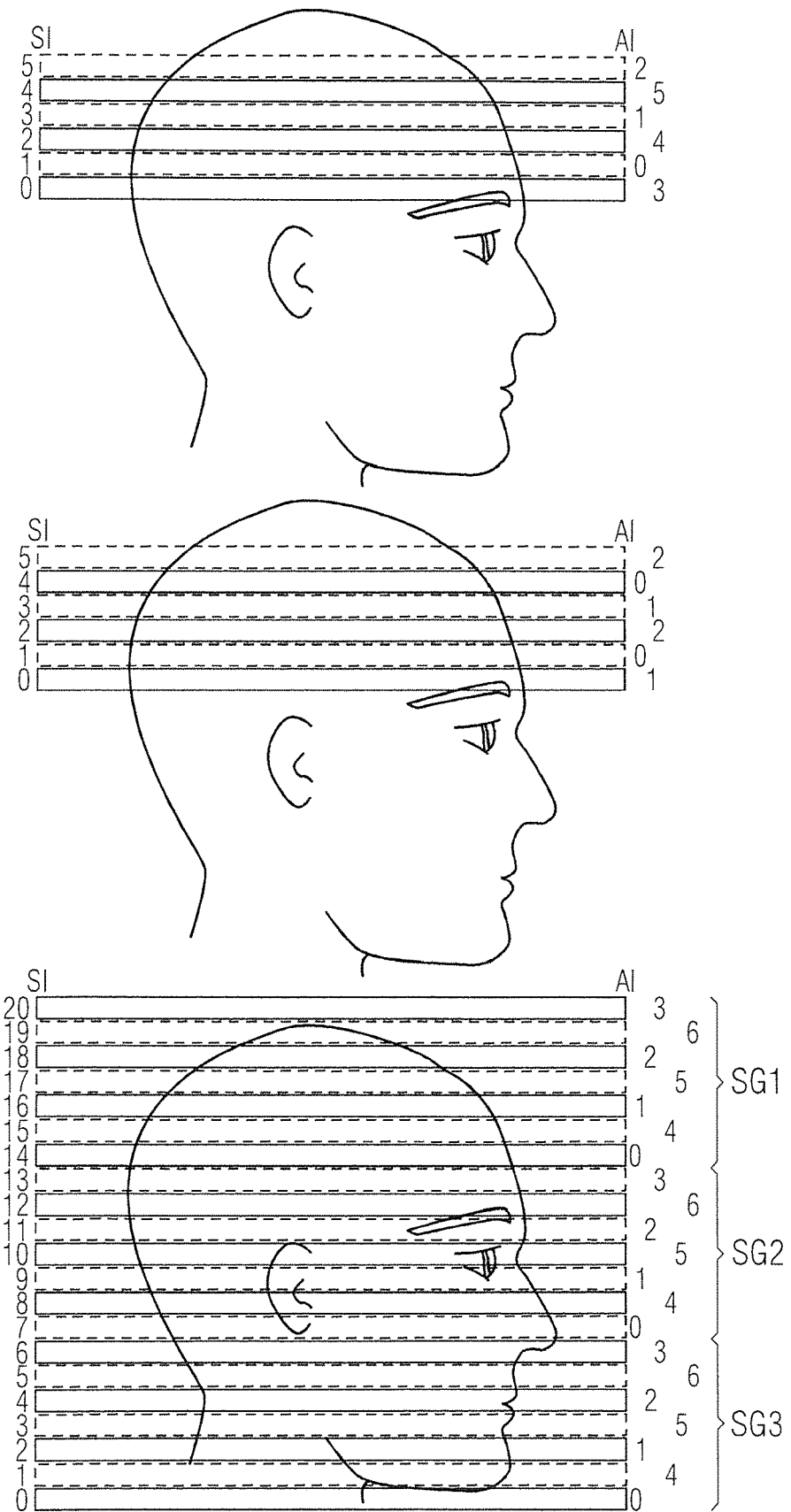
FIG. 1 schematically illustrates a number of acquisition patterns for simultaneous recording of multiple of slices.

FIG. 1 shows three diagrams for illustrating an acquisition scheme for simultaneous multi-slice imaging (SMS). The top illustration shows an acquisition scheme for an MR magnetic resonance imaging method with individual slice recording. An unaccelerated scan having six slices recorded in a convoluted manner is shown. For the case of echo-planar imaging, six slice excitations and six readout cycles are required for this purpose. The left edge of the top diagram shows a slice index SI of a respective slice. The slice index SI runs in this case from 0 to 5. The right edge of the top diagram shows acquisition indices AI. These indicate the sequence in which a particular slice is excited and read out. Excitation of individual slices occurs in the top diagram takes place in a sequence that does not proceed precisely in numerical order. In other words, the slices are excited and read out in the sequence 1, 3, 5, 0, 2, 4.

In a middle image representation in FIG. 1, six slices are likewise recorded, although with an accelerated SMS imaging method with acceleration factor 2. In other words, two slices are always simultaneously excited and read out. Therefore only three excitation and readout cycles are required for acquisition with this imaging method. This is also indicated by the acquisition indices AI illustrated at the right edge, which in this case run only from 0 to 2. Slices 1 and 4 are recorded in a first excitation and readout cycle, slices 0 and 3 in a second cycle and slices 2 and 5 are recorded in a third cycle.

The bottom image of FIG. 1 shows an image recording of 21 slices with the use of an accelerated SMS imaging method with acceleration factor 3. In other words, three slices are always simultaneously excited and read out. Therefore only seven excitation and readout cycles are required for the acquisition with this imaging method. This is also shown by the acquisition indices AI illustrated at the right edge, which in this case run only from 0 to 6. Slices 0, 7 and 14 are recorded in a first excitation and readout cycle, slices 2, 9 and 16 are recorded in a second cycle and slices 4, 11 and 18 in a third cycle. Slices 6, 13 and 20 are recorded in a fourth excitation and readout cycle, slices 1, 8 and 15 in a fifth cycle and slices 3, 10 and 17 in a sixth cycle. Finally, the remaining slices 5, 12 and 19 are recorded in a seventh cycle. As the simultaneously recorded slices are optimally distributed over the volume, the signals of the simultaneously recorded slices are not distorted by interactions between individually excited slices, and this could be the case, for example, if directly adjacent slices were excited simultaneously. The image region to be read out is divided into slice groups SG1, SG2, SG3, of which only one slice respectively from a slice group SG1 is ever simultaneously scanned with slices which are associated with the other slice groups SG2, SG3.

Figure 2:
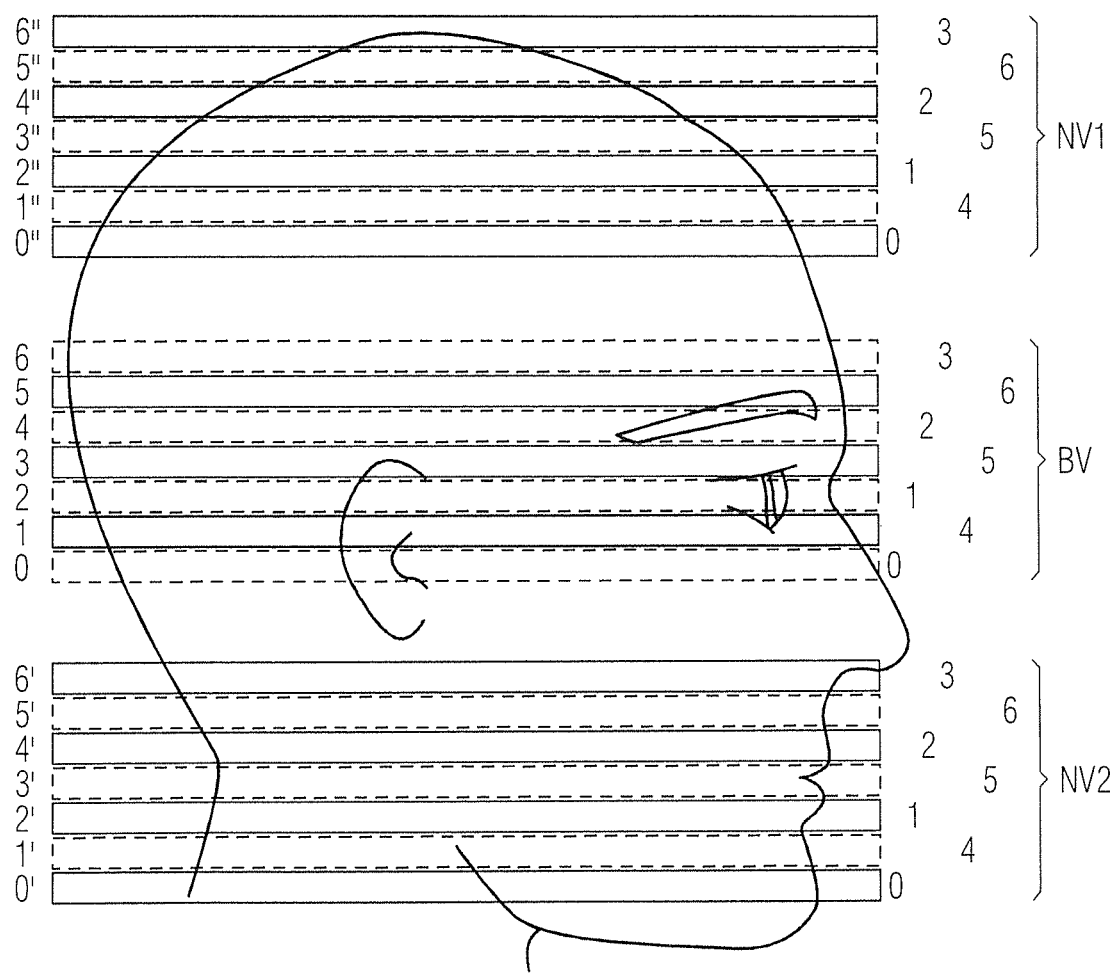
FIG. 2 schematically illustrates an acquisition scheme with simultaneous recording of navigator slices and image volume slices according to an exemplary embodiment of the invention.

FIG. 2 schematically illustrates an acquisition scheme with simultaneous recording of navigator slices and image volume slices in the head region of a patient according to an exemplary embodiment of the invention. Seven imaging slices of a middle head area are acquired and navigator slices of the navigator volumes NV1, NV2 are simultaneously recorded above and below the image volume BV. Overall, three slices, an image slice and a navigator slice from the region above the image volume and below the image volume respectively, are always simultaneously recorded therefore. The slice spacings of the simultaneously excited slices, for example the slices with the slice indices 2, do not have to be identical. Depending on the specific application it can be expedient to position one of the two navigator blocks NV1, NV2 closer to the image volume BV than the other navigator block, viewed in the slice direction.

A series of pulse sequences will be described below with which simultaneous imaging of navigators and image volumes is particularly effectively possible. Basically, all known pulse sequences for simultaneously imaging multiple slices, also called SMS pulse sequences, can be used for this purpose. Usually with SMS pulse sequences of this kind, different RF excitation pulses are used for different simultaneously excited slices, which pulses differ, for example, with regard to the frequency or phase. By contrast, the gradient pulses used for controlling a slice stack of a plurality of slices act globally on all simultaneously excited slices.

There is also the possibility of varying the simultaneous excitation such that for the simultaneously excited slices, excitation pulses having differing amplitude, duration and form or entirely different pulse sequences are employed, so their properties can be adapted to the specific requirements for navigators and the recording of an image volume. For example, different contrasts can be generated for the navigator slices and the image slices with simultaneous imaging and navigation. The variation in the contrasts can be used, for example, to reduce the additional SAR exposure due to the navigator. Furthermore, a required RF peak output for the simultaneous pulse irradiation can also be reduced with a change in the contrast of the navigator. In this way maximum values contingent on construction can be adhered to without changing the contrast during imaging itself. The case may also occur where the contrast for imaging is unsuitable for the navigator recording since it is connected, for example, to an inadequate signal-to-noise ratio. The two requirements can be taken into account better as the contrast for navigator recording is chosen independently of the contrast for image recording. Furthermore, when the same slice is then also used for image recording, a pre-saturation effect due to a navigator recording can be reduced by appropriate contrast selection for the navigator, so the image quality of the relevant slice is improved in the subsequent image recording of this slice.

In the following examples of suitable pulse sequences, which are shown in FIG. 3 to FIG. 9, one simultaneous excitation of a navigator slice and an image volume slice respectively is described. However, it is also possible, as has already been illustrated in FIG. 2, to excite a number of navigator slices at the same time as one or more image volume slice(s) or even a number of image volume slices at the same time as a navigator slice. These variants also form the subject of the present application.

Figure 3:
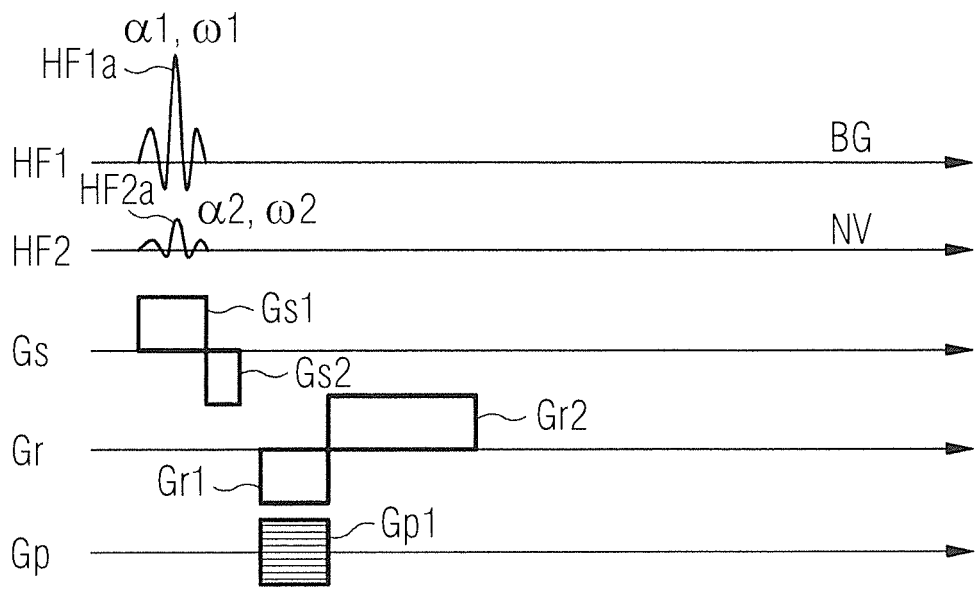
FIG. 3 shows the course over time of a first SMS pulse sequence that can be used for an acquisition method corresponding to the scheme in FIG. 2.

FIG. 3 shows the course over time of a first SMS pulse sequence that is designed for simultaneous scanning of a navigator volume and an image volume. In the exemplary embodiment shown in FIG. 3, the number of simultaneously excited and read out slices is limited to two. This is solely for the purpose of improved clarification. Of course more than two slices can also be simultaneously excited and read out with the inventive method. In addition, with scanning of a region to be examined there is a repetition of excitation with the illustrated pulse sequence, e.g. for different slices of the image volume to be scanned and the navigator volume to be scanned simultaneously, wherein the parameters of the excitation pulses (the excitation frequency) and gradients (the amplitude) change.

The first line HF1 shows a first RF excitation pulse HF1$a$ having a frequency offset co1 and a flip angle $\alpha_1$. A slice in an image volume is excited with the first RF excitation pulse. The second line HF2 shows a second RF excitation pulse HF2$a$ having a frequency offset $\omega_2$ that differs from the frequency offset co1 of the first RF excitation pulse HF1$a$ and a flip angle $\alpha_2$ that differs from the flip angle $\alpha_1$. A slice in a navigator volume NV is excited with the second RF excitation pulse HF2$a$ at the same time as the first RF excitation pulse HF1$a$. The third line Gs shows a slice selection gradient Gs1. The frequency offset $\omega_1$, $\omega_2$ of the RF excitation pulses HF1$a$, HF2$a$, together with the amplitude of the slice selection gradient Gs1, determine the position of the excited slices. A gradient Gs2 employed according to the gradient Gs1 in the slice direction serves as a rephasing gradient. Two frequency coding gradients Gr1, Gr2 can be seen in the fourth line Gr and the fifth line Gp illustrates a phase coding gradient Gp1. K-space is scanned for the two slices chosen with the slice selection gradient Gs1 with the use of the frequency coding gradients Gr1, Gr2 and the phase coding gradient Gp1. The separation of the acquired raw data or reconstructed image data of the two slices is then in carried out in an evaluation step on the basis of the spatial sensitivity profiles of the receiving coils, for example with the basically known GRAPPA method or the SENSE method. An image reconstruction of the separated raw data then occurs (for the case of the GRAPPA method) in the manner described in the introduction.

As spins with different flip angles are excited for the two slices of the image volume and the navigator volume, two images having different contrast properties are recorded simultaneously. The connection between excitation of the flip angle $\alpha_1$ and the image intensity S and further parameters, such as the echo time TE and repetition time TR, produces the following in the case of the gradient echo with given material parameters, i.e. longitudinal relaxation T1, transversal relaxation T2(*) and proton density PD:

$$S = PD \cdot \frac{1 - e^{-\frac{TR}{T1}}}{\left(1 - e^{-\frac{TR}{T1}} \cdot \cos\alpha_i\right) \cdot e^{-\frac{TE}{T2(*)}}} \quad (1)$$

In the case of excitation with different flip angles $\alpha_i$, different slices therefore have different image intensity values S and therefore also different contrast values.

It is therefore possible to record an image, having a contrast different from a navigator region, of an image region of an object to be examined.

A different contrast in the recording of the navigator volume compared to the image volume has the advantage that, for example, the SAR exposure due to the navigator can be reduced. In addition, the RF peak output can be limited for the simultaneous pulse irradiation. An individual selection of the contrast for the navigator allows, for example, the navigator to be recorded at the same time as the image volume even if the contrast of the image recording is not suitable for the recording of the navigator volume. Furthermore, a pre-saturation effect of the navigator recording with regard to a subsequent image recording of the same slice or an adjacent slice can be avoided.

Figure 4:
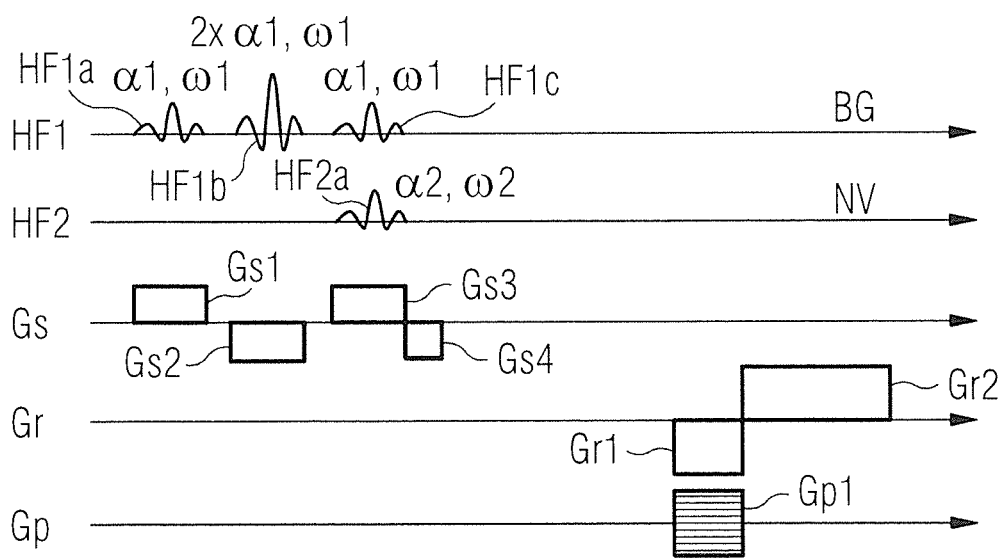
FIG. 4 shows the course over time of a second SMS pulse sequence with selective excitation of specific materials in the imaging slice that can be used for an acquisition method corresponding to the scheme in FIG. 2.

FIG. 4 shows a pulse sequence graph to illustrate a second SMS pulse sequence that is designed for simultaneous scanning of a navigator volume and an image volume. A slice BG of the image volume is chemically selectively excited by using a binomial pulse. A binomial pulse means a pulse sequence composed of a number of excitation sub-pulses HF1a, HF1b, HF1c. The term is derived from the amplitude ratio of the individual pulses. For example, amplitude ratios 1-1, 1-2-1 or 1-3-3-1 are possible in accordance with the binomial coefficient. With an excitation of this kind initially a first RF excitation sub-pulse HF 1 a having a first flip angle $\alpha_1$ and a first frequency offset $w_1$ is employed for a first slice BG (see line 1, identified by HF1), in this case a slice BG of the image volume. A second RF excitation sub-pulse HF1b having twice the flip angle $2\alpha_1$ and the same frequency offset $\omega_1$ is then employed for the first slice BG. A third RF excitation sub-pulse HF1c having the flip angle $\alpha_1$ and the first frequency offset $\omega_1$ is then employed for the first slice BG. At the same time as the respective RF pulses HF1a, HF1b, HF1c, gradient pulses Gs1, Gs2, Gs3 are also employed in the slice direction, with which a slice stack to be excited is selected. At the same time as the third RF excitation sub-pulse HF1c for the first slice, an RF excitation pulse HF2a having a second flip angle $\alpha_2$ and a second frequency offset $\omega_2$ is also employed for a second slice NV, in this case a navigator slice. The second slice NV is excited with a gradient echo sequence. The third slice selection gradient Gs3 already used for the slice selection of the third RF excitation sub-pulse HF1c of the first slice BG is also used for the slice selection of the RF excitations pulse HF2a of the second slice NV. A fourth gradient Gs4 is then employed in the slice direction for rephasing of the magnetization in both slices, moreover. The excitation of the spins of different molecules is briefly interrupted between the excitation sub-pulses to allow a desired phase evolution of the second spin species precessing at a different frequency. Since different binding states of the protons exist in different molecules, which react in different ways to external magnetic fields, the protons in different molecules have different precession frequencies and can therefore be selectively excited with a binomial pulse in the described manner.

Figure 5:
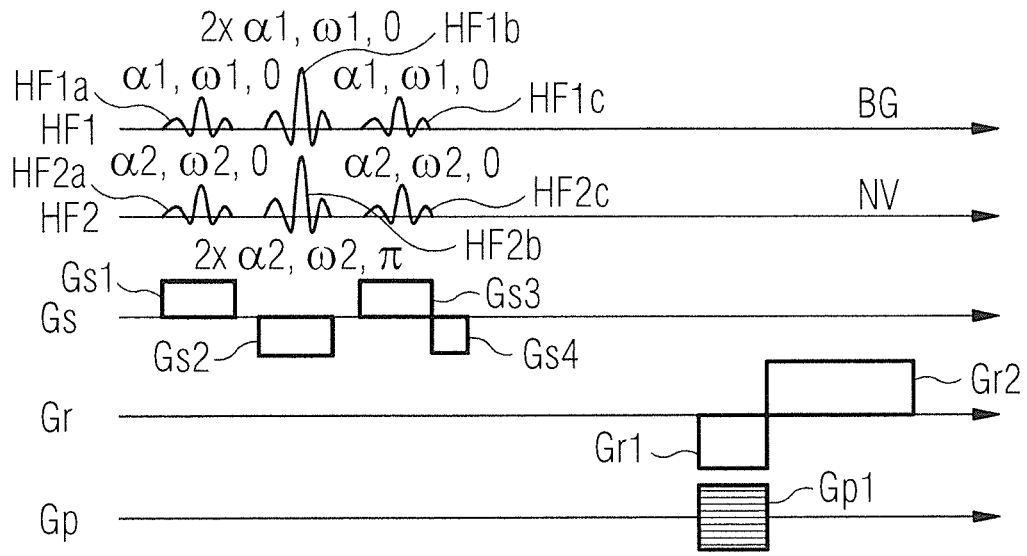
FIG. 5 shows the course over time of a third SMS pulse sequence with selective excitation of specific materials in the imaging slice and the navigator slice that can be used for an acquisition method corresponding to the scheme in FIG. 2.

FIG. 5 shows a pulse sequence graph for illustrating a third SMS pulse sequence which is designed for simultaneous scanning of a navigator volume and an image volume. In contrast to the second SMS pulse sequence shown in FIG. 4, with the third pulse sequence different spin species are chemically selectively excited in both slices, i.e. a navigator slice NV and an imaging slice BG. When using binomial pulses this works, for example, by inverting the phase of each second RF excitation sub-pulse HF2b.

For the specific case where hydrogen nuclei of the fat molecules are excited in one slice, for example the navigator slice NV, and hydrogen nuclei of the water molecules are excited in the other slice, for example the imaging slice BG, there is no pre-saturation of the water-bound portion in the slice with excitation of the nuclei of the fat-bound hydrogen atoms. The slice identified as the navigator slice NV can therefore then still be used for imaging as well without limitation or sacrifices in image quality.

A first spin species of a first type of molecule, in this case water molecules, is excited with a first binomial pulse for the imaging slice BG, which includes first to third RF excitation sub-pulses HF1a, HF1b, HF1c. At the same time a second spin species of a second type of molecule, in this case fat molecules, is excited in the navigator slice with a second binomial pulse for the navigator slice NV, which includes first to third RF excitation sub-pulses HF1b, HF2b, HF3b.

In detail, initially a first RF excitation sub-pulse HF1a having a first flip angle $\alpha_1$, a first frequency offset $\omega_1$ and a phase having the value 0 is employed for a first slice (see line 1, identified by HF1), in this case an imaging slice BG. At the same time as the first RF excitation sub-pulse HF1a for the first slice BG, a first excitation sub-pulse HF2a having a second flip angle $\alpha_2$ and a second frequency offset $\omega_2$ and a phase having the value 0 is also employed for the second slice NV, in this case a navigator slice. At the same time as the two RF excitation sub-pulses a slice selection gradient Gs1 is also switched in the slice direction Gs, with which the excitation of the spins is limited to a chosen slice stack that includes imaging slice BG and navigator slice NV.

There is then a short pause during which a desired phase evolution of the second spin species precessing at a different frequency from the first spin species is enabled. A second RF excitation sub-pulse HF1b having twice the flip angle $2\alpha_1$ and the same frequency offset $\omega_1$ is then employed for the first slice, i.e. the imaging slice BG. At the same time as the second RF excitation sub-pulse HF1b of the first slice BG, a second RF excitation sub-pulse HF2b is also employed for the second slice NV. Compared to the first RF excitation pulse HF2a, the second RF excitation sub-pulse HF2b for the second slice NV has twice the flip angle $2\alpha_2$ and the same frequency offset $\omega_2$, but a phase that is different by 180°. At the same time as the two second RF excitation sub-pulses HF1b, HF2b, a second gradient pulse Gs2 is employed in the slice direction. A short pause is then observed again in which a desired phase evolution of the second spin species precessing at a different frequency from the first spin species is enabled. A third RF excitation sub-pulse HF1c having the flip angle at and the first frequency offset $\omega_1$ is then employed for the first slice BG. At the same time as the third RF excitation pulse HF1c for the first slice BG, a third RF excitation sub-pulse HF2c is employed for the second slice NV, and this has the same flip angle $\alpha_2$ and the same frequency offset $\omega_2$ and the same phase having the value 0 as the first RF excitation sub-pulse HF2a for the second slice NV. In addition, at the same time as the third RF excitation sub-pulses HF1c, HF2c, a third gradient pulse Gs3 is also employed in the slice direction, with which a slice stack to be excited, in which the first slice BG and the second slice NV are included, is likewise selected. The slice stack is therefore selected with the same gradient pulses Gs1, Gs2, Gs3 in the two slices BG, NV. At the end of the chemically selective excitation process, a rephasing gradient Gs4 is then employed in the slice direction. Finally, the readout process described in FIG. 3 and FIG. 4 takes place with the use of readout gradients Gr1, Gr2 and a phase coding gradient Gp1.

Figure 6:
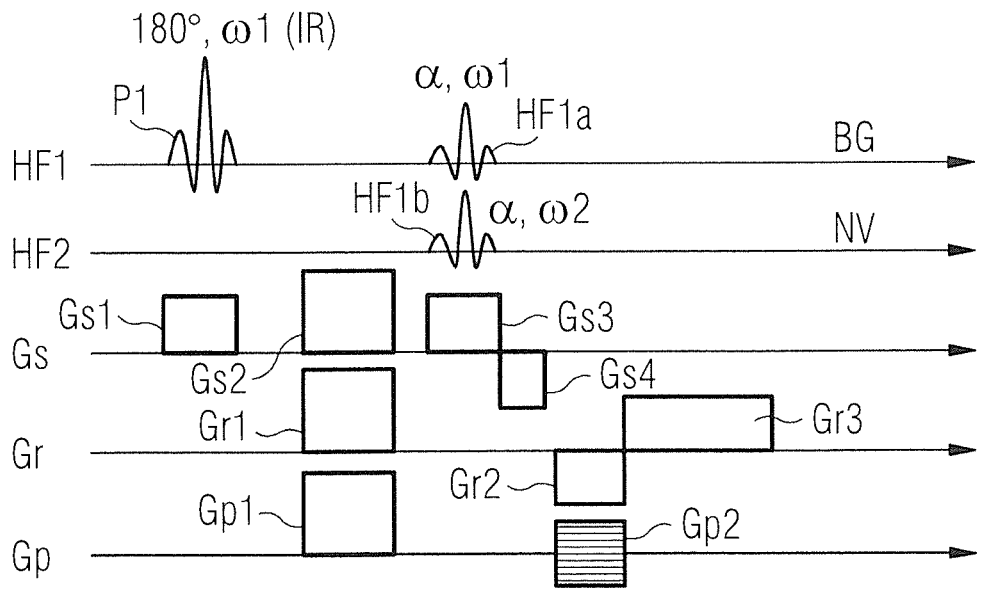
FIG. 6 shows the course over time of a fourth SMS pulse sequence that can be used for an acquisition method corresponding to the scheme in FIG. 2.

FIG. 6 illustrates a pulse sequence graph for illustrating a fourth SMS pulse sequence that is designed for simultaneous scanning of a navigator volume and an image volume. Slice-dependent contrast preparations—for example an inversion, saturation or T2 preparation—are implemented for only one of the two slices in this exemplary embodiment for the imaging slice BG. For this purpose a first RF preparation pulse P1 having a flip angle of 180° and a frequency offset $\omega_1$ is employed for preparation of the contrast of a first slice BG, in this case an imaging slice. At the same time, a first slice selection gradient Gs1 is employed. Spoiler pulses Gs2, Gr1 and Gp1 are then employed as the gradient pulses in all directions, i.e. in the slice selection direction, in the frequency coding direction and in the phase coding direction. Next, RF excitation pulses HF1a, HF2a are simultaneously employed for the two slices, i.e. for the imaging slice BG and for the navigator slice NV, having the same flip angle, but different frequency offsets $\omega_1$, $\omega_2$ for different slices. In this specific case these RF excitation pulses are part of a gradient echo sequence. Therefore a further rephasing pulse Gs4, which likewise acts on the two slices BG, NV, follows a gradient pulse Gs3 in the slice direction, employed at the same time as the RF excitation pulses HF1a, HF2a. Finally, a readout process take place in the usual manner with the use of gradients Gr2, Gr3 in the frequency coding direction and a gradient Gp2 in the phase coding direction.

FIG. 7 shows a pulse sequence graph for illustrating a fifth SMS pulse sequence that is designed for simultaneous scanning of a navigator volume and an image volume. Different slice-dependent contrast preparations are used for the two slices here. The construction of the fifth pulse sequence largely matches the construction of the fourth pulse sequence, with the exception that a preparation pulse P2 is employed for the navigator slice NV at the same time as the preparation pulse P1 for the imaging slice BG. This second preparation pulse P2 has a flip angle of 90° and a frequency offset $\omega_2$ that is different from the frequency offset $\omega_1$ of the first preparation pulse P1. In this way different preparations can be implemented in the simultaneously recorded navigator slice NV and the imaging slice BG and different contrasts can be simultaneously acquired accordingly.

FIG. 8 shows a pulse sequence graph for illustrating a sixth SMS pulse sequence which is designed for simultaneous scanning of a navigator volume and an image volume. Pulse sequences with a different sequence type are used in the case of the sixth pulse sequence for different simultaneously excited slices. A first slice is therefore acquired with a first pulse sequence, for example with a spin echo sequence, at the same time as a second slice is acquired with a second sequence with a different sequence type, a gradient echo sequence in the specifically illustrated case.

For this purpose a first slice NV, in this exemplary embodiment a navigator slice, is excited by a first excitation pulse HF1a having a first flip angle $\alpha_1$ and a frequency offset $\omega_1$ (see second line HF1). Part of the spin echo sequence, with which the first slice NV is excited is also a refocusing pulse HF1b having a flip angle $\beta_1$ and the same frequency offset $\omega_1$ as that of the first excitation pulse HF1a. The frequency offset of the refocusing pulse HF1b then only has to be the same as that of the first excitation pulse HF1a if the amplitudes of the respectively associated slice selection gradient are also the same. In general the associated slice selection gradients can have different amplitudes and the frequencies of the first excitation pulse HF1a and of the refocusing pulse HF1b can also be different therefore.

Refocusing of the spins excited in the first slice NV with the use of the first excitation pulse HF1a is carried out with the refocusing pulse HF1b. Furthermore, within the scope of the simultaneous imaging method a second slice BG, in this exemplary embodiment an imaging slice, is excited with a second excitation pulse HF2a having a flip angle $\alpha_2$ and a frequency offset $\omega_2$, which each differ from the flip angle $\alpha_1$ and the frequency offset $\omega_1$ respectively of the excitation pulse HF1a and refocusing pulse HF1b applied to the first slice NV (see first line HF2). For slice selection a slice selection gradient Gs1 is employed at the same time as the first excitation pulse HF1a.

A gradient Gs2 and then a rephasing gradient Gs3 are then brought in in the z direction. The gradient Gs2 is used as a slice selection gradient of the refocusing pulse HF1b of the spin echo sequence and as the slice selection gradient of the excitation pulse HF2a of the gradient echo sequence. With the use of the gradients Gr1, Gr2 and Gp1, k-space for the two slices to be mapped simultaneously is then scanned as in the case of the imaging method in FIG. 3 to FIG. 7.

With this exemplary embodiment, one of the simultaneously recorded slices NV can be recorded as a spin echo and the other BG as a gradient echo. For example, the navigator signal can therefore be recorded as a spin echo in the case of the T2*-weighted imaging, without disruptive influences from ambient gradients.

With this combination of simultaneously excited spin and gradient echoes the gradient pulses have to be effectively carefully adjusted for the two slices NV, BG. The following two conditions must apply for both echo paths:

The effective gradient moment must disappear (with phase coding of the central line, i.e. Gp1=0) at the echo time (middle of Gr2).

At the same time, a gradient moment that is not zero must exist for the spin echo path before application of the refocusing pulse HF1b.

This is achieved, for example, with the sequence illustrated in FIG. 8. All gradients up to the center of the second excitation pulse HF2a act only on the spin echo path and all subsequent gradients act on both echo paths in the same way.

Readout and phase coding gradients are only applied after the second excitation pulse HF2a in this example and act on both echo paths therefore. The gradient pulses Gs1, Gs2, Gs3 along the slice axis are applied such that the conditions mentioned above are met. The gradient echo path experiences only the slice gradient pulses Gs2 (from the center of excitation pulse HF2a) and Gs3. In terms of amplitude and duration Gs3 is chosen such that the relevant portion of Gs2 is compensated for the gradient echo path.

If the refocusing pulse HF1b of the spin echo (line HF1) were to be applied at the same time as the excitation pulse HF2a of the gradient echo sequence, the effective slice gradient moment would have to be chosen to be equal to zero from the center of the refocusing pulse HF1b. Accordingly, a slice moment of zero would also have to be adjusted before the refocusing pulse HF1b, although this would conflict with the second stated condition that requires that there is a gradient moment that is not zero before application of the refocusing pulse HF1b. For this reason the refocusing pulse HF1b is applied after a delay, and this simultaneously represents a further advantage with regard to the required RF peak output. For example, the refocusing pulse HF1b can be postponed to the extent that:

$$Gs1 \cdot \frac{T(HF1a, \alpha_1)}{2} - Gs2 \cdot Tshift + Gs3 \cdot T(Gs3) = 0 \qquad (2)$$

Here T(HF1a, $\alpha_1$) is the duration of the first excitation pulse HF1a, Tshift indicates the shift time with which the refocusing pulse HF1b is shifted relative to the second excitation pulse HF2a, and T(Gs3) is the duration of the third gradient Gs3 in the slice direction. Gs1, Gs2 and Gs3 indicate values of the gradients.

Larger shifts may be achieved by, for example, simultaneously lengthening the first gradient Gs1 in the slice direction beyond the duration of the first excitation pulse HF1a, or the gradient pulse Gs2 simultaneously beginning even before the start of the refocusing pulse HF1b.

In addition to the simultaneous acquisition of different contrasts, a further central advantage can be seen in that the proposed technique can be applied for spin echo sequences for which acceleration by way of Simultaneous Multi Slice is possible to only a very limited extent. The critically limiting factor here is the simultaneous implementation of the 180° pulse (RF refocusing pulse) on a number of slices for generating the spin echo. The cause of this is the exceeding of the admissible maximum value for the SAR entry by constructive overlaying of the 180° pulses. Precisely this problem is avoided by the procedure described in connection with FIG. 8, in which delayed bringing-in of the excitation pulse of the gradient echo sequence and of the 180° pulse, i.e. of the RF refocusing pulse of the spin echo sequence, is performed, since simultaneous refocusing of the magnetization of simultaneously mapped slices is avoided.

With this technique it is particularly advantageously possible to simultaneously record a turbo-spin echo in one or more slice(s) and a gradient echo in one or more different slice(s).

Readout and phase coding gradients are identical for the two signal paths; the images are therefore implicitly registered on top of each other. This corresponds to the preceding illustration through to recording of the first echo. Readout and phase coding gradients are refocused after the first data acquisition. An additional gradient with the moment G1*T (HF1,α1)/2 must be applied before any further refocusing pulse in order to take account of the additional slice-gradient moment due to pulse shift and rephasing gradient.

Figure 9:
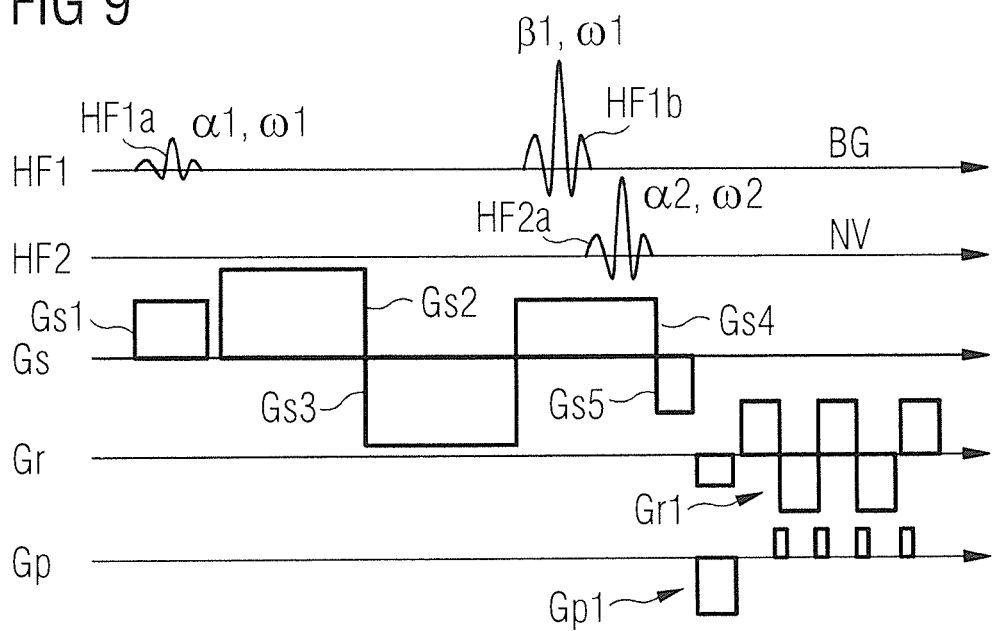
FIG. 9 shows the course over time of a seventh SMS pulse sequence that can be used for an acquisition method corresponding to the scheme in FIG. 2.

The graph in FIG. 9 shows an exemplary embodiment for simultaneous acquisition of a diffusion sequence, wherein, in the specifically illustrated case, an echo-planar spin echo sequence is applied for mapping an imaging slice BG and a navigator sequence, in this case an echo-planar gradient echo EPI sequence, for imaging a navigator slice NV.

A first slice, in this case an imaging slice BG, is excited with a first RF excitation pulse HF1a having a first frequency $\omega_1$ and a first flip angle ai within the context of a diffusion sequence (see first line HF1). At the same time a slice selection gradient Gs1 is also employed (see third line Gs). Two diffusion gradients Gs2, Gs3 are then successively employed in the slice selection direction. At the same time as a further slice selection gradient Gs4, an RF refocusing pulse HF1b is then employed for the diffusion imaging, with which a spin echo or a series of spin echoes is triggered. An RF excitation pulse HF2a is employed for the excitation of a navigator slice NV with a shift in terms of time in relation to the RF refocusing pulse HF1b, but still simultaneous with the further slice selection gradient Gs4. A rephasing gradient Gs5 is then switched with which a gradient echo is triggered for the navigator slice NV. The gradient echo and the triggered spin echoes are then read out with a series of phase coding gradients Gp1 and frequency coding gradients Gr1.

While the gradient Gs1 is a slice selection gradient, the two gradients Gs2 and Gs3 are diffusion coding gradients. These do not necessarily have to be applied in the slice direction. For example, diffusion gradients having different directions and amplitudes can be successively employed during the scan to obtain information about the amplitude and direction of the movement of the molecules in the region to be mapped. The diffusion gradients do not necessarily have to be applied one immediately after the other either, as is shown in FIG. 9. Instead they can also have an interval. More than two diffusion gradients can also be employed if an insignificant gradient moment results overall.

With this exemplary embodiment the navigator is independent of the applied diffusion gradients. A rigid movement model is therefore adequate for the case of application to the head. Furthermore, a navigator slice NV of sufficient quality can be scanned therefore even with high b values of imaging, with an appropriately low signal-to-noise ratio.

FIG. 9 shows an example in which diffusion coding gradients Gs2, Gs3 are only applied before the refocusing pulse. If the spin echo refocusing pulse HF1b and the gradient echo excitation pulse HF2a are completely separate time-wise (cf. statement above relating to lengthening of Tshift), diffusion gradients can also be distributed among the times before and after the refocusing pulse HF1b.

Figure 10:
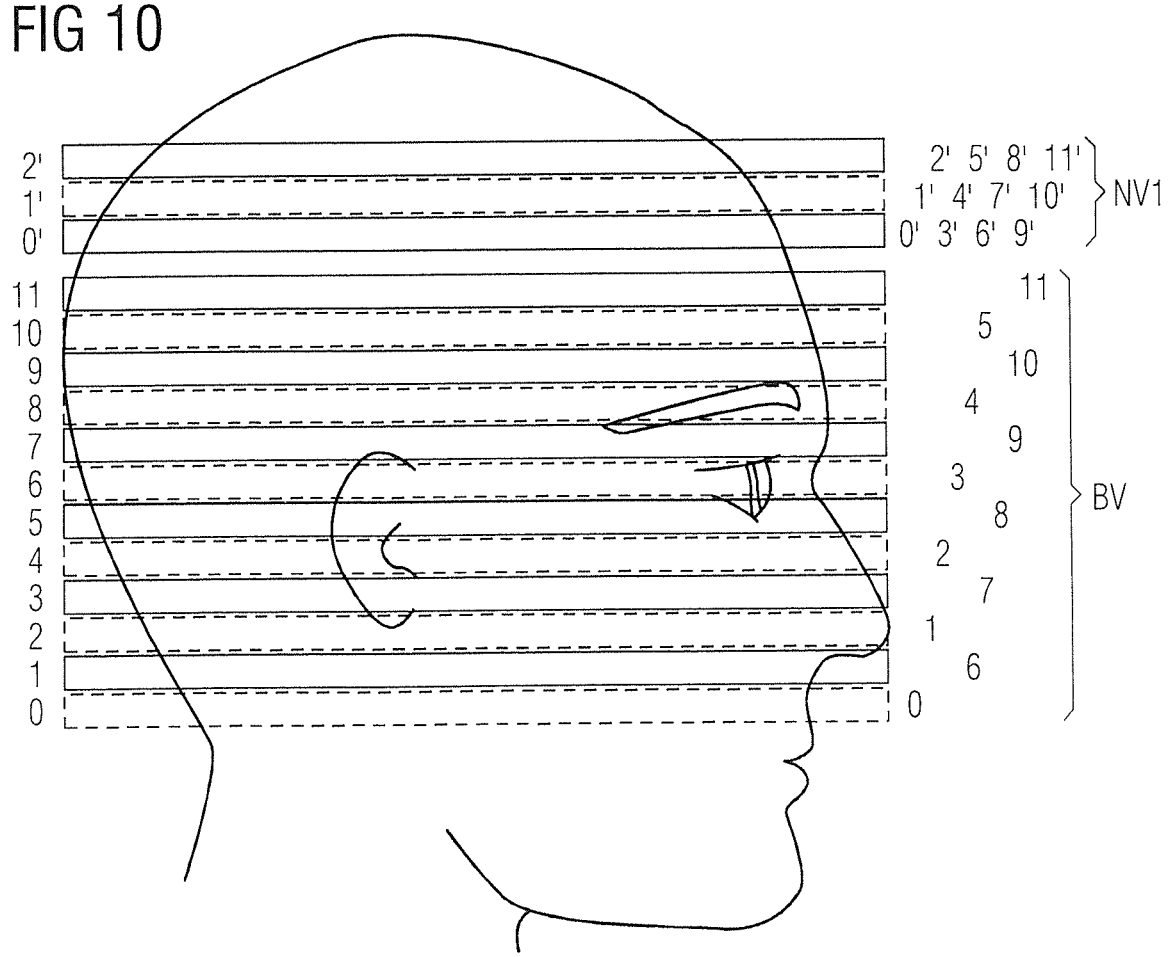
FIG. 10 is a schematic illustration of an acquisition scheme with simultaneous recording of navigator slices and image volume slices according to an exemplary embodiment of the invention, wherein the recording of the navigator slices is accelerated.

FIG. 10 shows a schematic illustration of an acquisition scheme with simultaneous recording of navigator slices and image volume slices according to an exemplary embodiment of the invention, wherein recording of the navigator slices is accelerated. As with the acquisition shown in FIG. 2, in addition to the excitation pulse of the MR imaging sequence, further slices are excited at the same time whose image information is subsequently used solely for movement correction, for the implement of the inventive navigators.

With the scheme shown in FIG. 10 a slice group BV and a navigator region NV1 positioned above the slice group BV to be mapped are mapped by a convoluted acquisition scheme. The slice group BV comprises slices 0 to 11 to be scanned of an image volume. The orientation of the slice group BV should be corrected of patient movements with the use of the recording of the navigator volume. The navigator volume used for this is acquired using a recording technique called FastNav. The navigator volume has just three slices and the navigator slices are acquired by simultaneous excitation with the slices of slice group BV. As also emerges from the acquisition indices, a complete navigator volume exists as early as after the acquisition of three slices of the slice group BV. A completely acquired FastNav volume in turn exists, etc. after a further three scans of the slice group BV. In this example a scan rate that is accelerated by the factor four compared to the scan rate of the volume of the slice group BV is therefore achieved for the scan of the FastNav volume.

The navigator volume NV1 is therefore recorded at a much higher speed than the image volume BV. This allows more precise movement correction of the mapped image volume, and this is advantageous in particular in the case of fast movements in the region of the image volume BV.

In addition to the different speed of scanning of the navigator slices and image volume slices, identical excitation pulses are not used for mapping the image volume and the navigator volume. Instead specially adjusted excitations are used for the navigator slices. The adjustment includes, for example, an altered flip angle for minimizing the SAR exposure. It is also possible, however, to achieve, for example, a different slice thickness or even a different sequence type or a different contrast preparation with appropriately adjusted pulse sequences. Examples of pulse sequences to be applied have been illustrated in connection with FIG. 3 to FIG. 9.

With the image recording method illustrated by FIG. 10 a reference volume is acquired for the subsequent navigator scan at the beginning of the scan. Each subsequently scanned navigator is registered on the present reference volume by methods of movement detection. The recording can be corrected in respect of movements that occur in the imaging slice by applying the movement parameters determined hereby to a simultaneously acquired MR imaging slice. Furthermore, the detected movement is applied to the orientation of the image parts to be scanned in future in order to achieve prospective movement compensation. Of course the ascertained movement parameters can also be used for retrospective movement correction methods.

Figure 11:
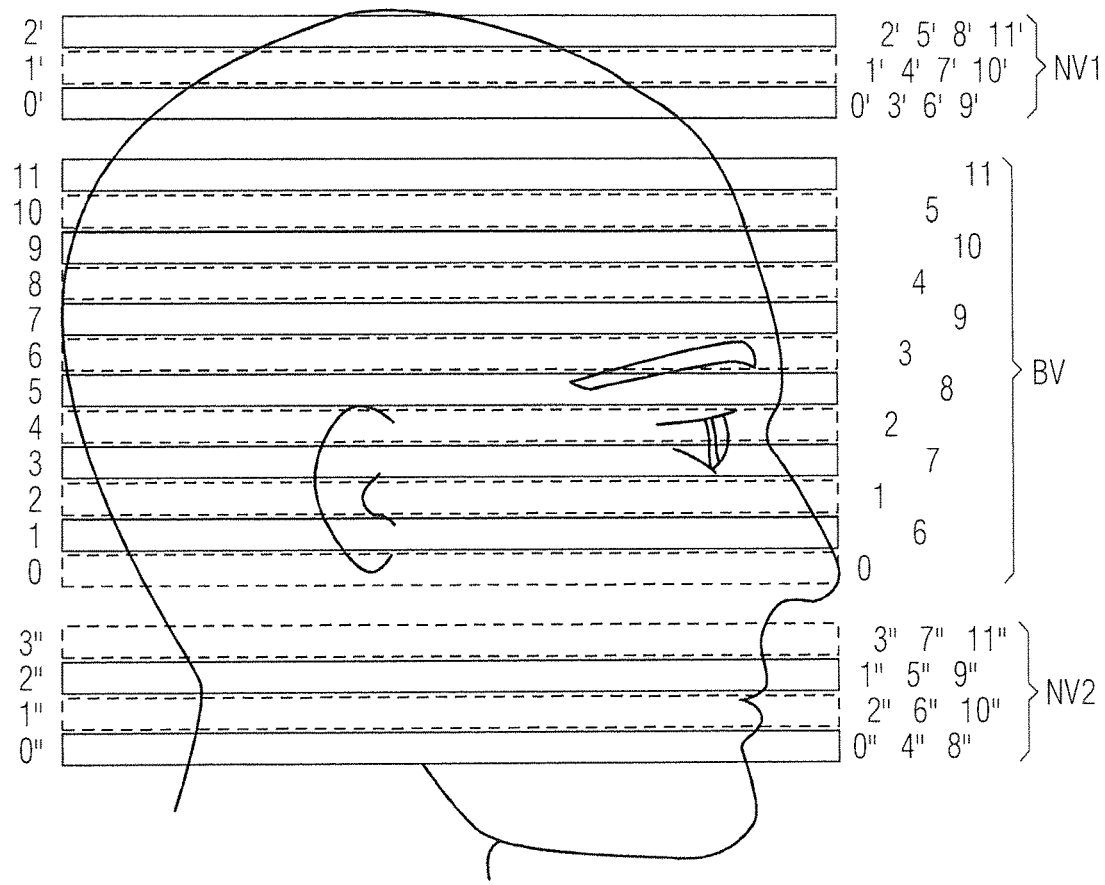
FIG. 11 is a schematic illustration of an acquisition scheme with simultaneous recording of navigator volumes arranged at different positions in the slice direction and an image volume according to an exemplary embodiment of the invention, wherein the recording of the navigator volume is accelerated.

FIG. 11 shows a schematic illustration of an acquisition scheme with simultaneous recording of navigator volumes NV1, NV2 arranged at different positions and an image volume BV according to an exemplary embodiment of the invention, wherein recording of the navigator volume NV1, NV2 is accelerated. With the image recording method illustrated in FIG. 11 a first navigator volume NV1 located above the image volume BV is scanned, as in the method shown in FIG. 10, at four times the speed, whereas a second navigator volume NV2 located below the image volume BV is scanned at three times the speed. If the image volume BV has been completely scanned once therefore, the first navigator volume NV1 will have simultaneously been scanned four times and the second navigator volume NV2 three times.

The method illustrated above sometimes requires an additional adjustment in the step of image data separation. It may be necessary to adjust the separation of the simultaneously scanned slice information to different imaging parameters. This situation is illustrated in FIGS. 12 and 13.

The simultaneously scanned slices can be separated, for example, as proposed by Stab et al. Magnetic Resonance in Medicine 65:157 (2011). The proposed method includes applying the GRAPPA technique described by Griswold et al. Magnetic Resonance in Medicine (2002) for separating simultaneously excited slices which are shifted toward each other using the CAIPIRINHA technique by Breuer et al. Magnetic Resonance in Medicine (2005). For this purpose the volume to be depicted is scanned within the framework of a reference scan (before carrying out the imaging pulse sequence). For example, a complete volume with identical protocol parameters is sequentially scanned without applying the SMS acceleration. The signal, which would be expected with simultaneous excitation of a plurality of slices, is artificially generated from this reference data.

The protocol parameters of the reference scan do not have to be identical to the subsequently used protocol parameters, however. Quite the contrary, suitable sequences can be chosen which may be acquired quickly and have advantageous properties (e.g. are robust against movement). This procedure is described in Bhat et al., International Society for Magnetic Resonance in Medicine 22 (2014).

Figure 12:
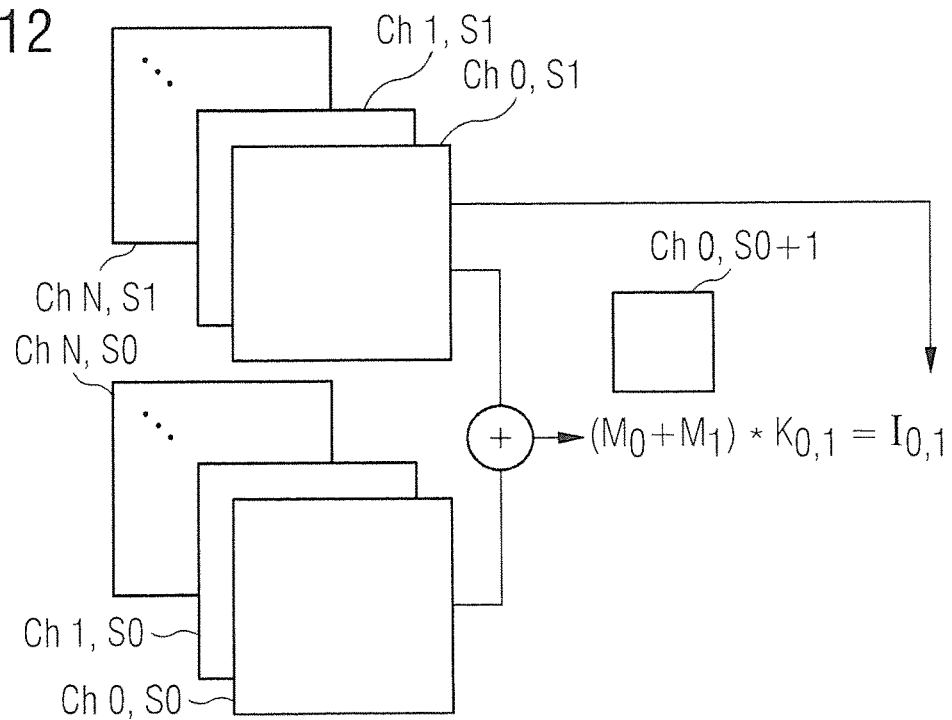
FIG. 12 shows the calculation of convolution matrices and convolution kernels within the framework of a reference scan.
Figure 13:
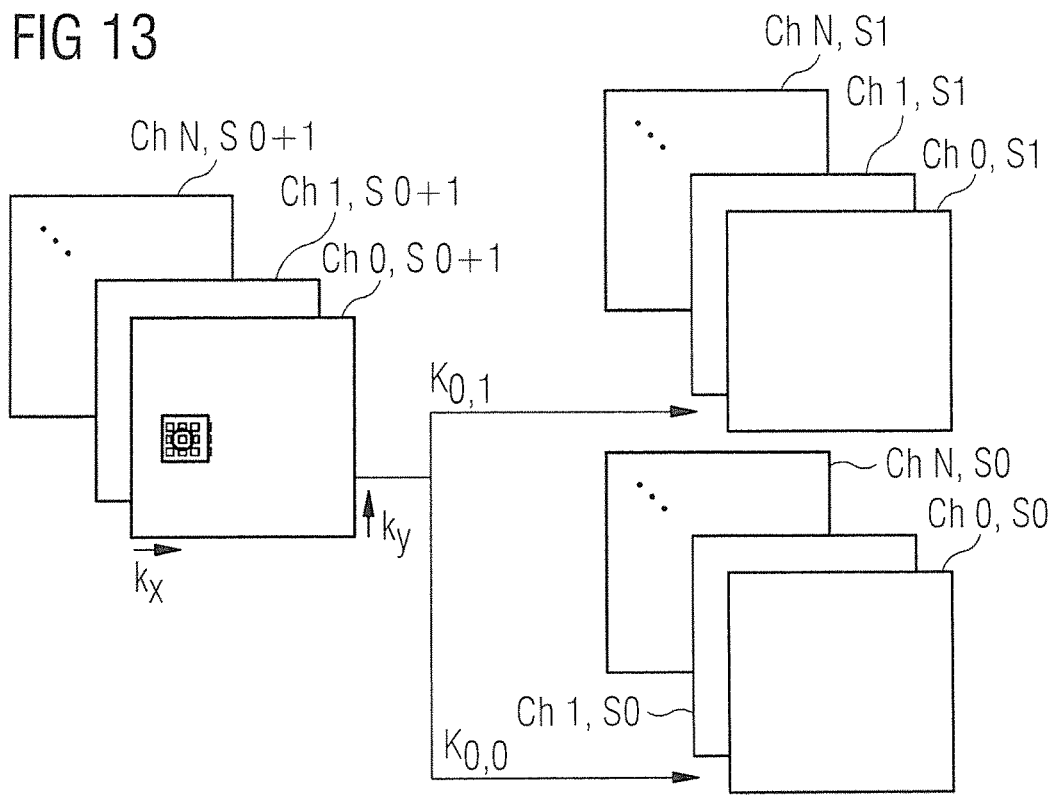
FIG. 13 shows the application of the convolution kernels for separating simultaneously scanned k-space raw data.

In FIG. 12 Ch n, Si designates scanned frequency data of the coil element n from the slice i (in FIG. 12 i=0) of the sequential scan, and Ch n, Sj designates the scanned frequency data of the coil element Ch n from the slice j (in FIG. 12 j=1) of the sequential scan. The image information from the slices i, j is combined in a convolution matrix $(M_i+M_j)$ (FIG. 12 shows the convolution matrix (M0+M1) as an example) which represents the simultaneously scanned data. A convolution kernel $K_{n,j}$, which is capable of extracting the image information $I_{n,j}$ of slice j from the convolution matrix $(M_i+M_j)$ z, is determined for each slice j to be separated.

During the course of image acquisition by way of the SMS-accelerated MR sequence, the convolution kernels determined in this way are used to fragment the information simultaneously scanned with a plurality of coils in respect of a number of slices into the individual slices and image information associated with coils. This process is illustrated in FIG. 13. For example, FIG. 13 shows a convolution kernel $K_{0,1}$ with which the mixed raw data of the slices 0 and 1 of all coils Ch0-ChN are weighted in order to obtain the raw data of the coils associated with the slice 1. FIG. 13 also shows a convolution kernel $K_{0,0}$ which extracts the raw data of slice 0 from the mixed raw data of slices 0 and 1 of coils Ch0-ChN.

To calculate a data point in the raw data slice S0 of the coil element Ch0, the scanned raw data of the simultaneously scanned slices S0+S1 of all coil elements Ch0 to ChN are weighted with the respectively associated kernels $K_{n,0}$. The calculation of a data point requires the use of N specific kernels when N describes the number of coil elements. A number of different kernels, which results from the product of the square of the number of N of coil elements, the SMS factor (acceleration factor) and the number of excitations, therefore exists overall for separation of the simultaneously scanned raw data.

The calculation of an individual point P in the separated raw data signal Ch0, S0 iterates over all (as yet unseparated) data Ch0, S0+1 to ChN, S0+1 and the kernel appropriate to this coil, to this excitation (S0+1), for this separated target slice (S0) is applied to the point P of each as yet unseparated data set n (i.e. Chn, S0+1). The result of these applications is added together and produces the value at point P in the separated raw data signal Ch0, S0.

N kernels are used for the calculation of a point in the separated raw data signal in the case of a number of N coil elements. To calculate a point in each target slice from the unseparated data, kernels are required whose number results from the product of the number N of coil elements and the SMS factor (acceleration factor).

If there is a desire to calculate a point in all target coils in each target slice, then kernels are required for this whose number results from the product of the square of the coil elements and the SMS factor.

If all points of all target coils of all target slices are calculated, then this does not change anything in relation to the number of kernels (still for one excitation!): The number of kernels therefore also corresponds in this case to the product of the square of the coil elements and the SMS factor.

There are separate kernels for different SMS excitations. Therefore, for all points, all target slices, all target coils the number of kernels in total is:

(number of coil elements)×(number of coil elements)×(number of SMS excitations)×SMS factor.

Sometimes an adjustment of the calculation of these convolution kernels is necessary for the illustrated separation method applied to the described imaging method in FIG. 2 to FIG. 11. It is therefore conceivable that specific convolution kernels have to be calculated for permutations of the imaging parameters and slice sequence. If, for example, a slice 51 is scanned with imaging parameters P1 and a slice S2 with parameters P2, a separate kernel may be necessary compared to acquisition S1 with parameters P2 and S2 with parameters P1. For higher acceleration factors this concept should be expanded analogously for all permutations of imaging parameters. The need for specific convolution kernels is governed by the difference in the image content, however, and cannot be universally answered. Instead it should be specifically checked for each application. Ideally convolution kernels can be used symmetrically, i.e. jointly for all slice-contrast permutations. As already mentioned, it is optionally necessary to calculate different kernels for simultaneously recorded slices if they have different spacings, as is the case with the described simultaneous recording of navigator slices and image volume slices.

Figure 14:
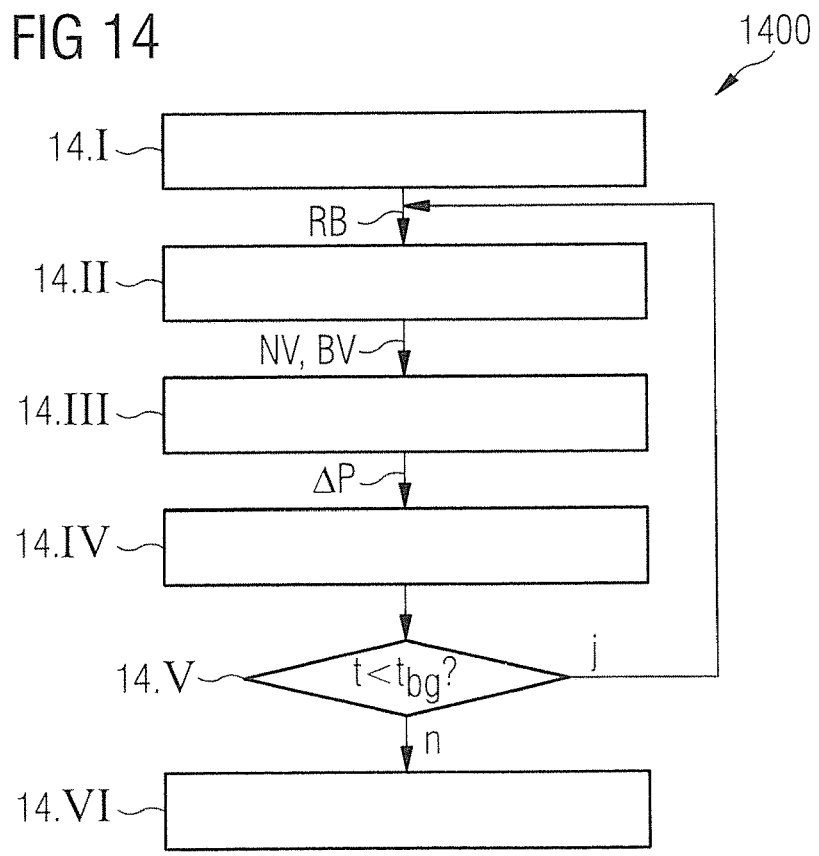
FIG. 14 is a flowchart that illustrates a method for controlling a magnetic resonance imaging apparatus according to an exemplary embodiment of the invention.

FIG. 14 shows a flowchart 1400 with which an imaging method is illustrated in which an image recording BV is prospectively corrected with the use of a simultaneous navigator recording NV in real time. As is customary, image recording or navigator recording is taken to mean not just the acquisition of raw data, but also its reconstruction using the methods described in the introduction. In step 14.I firstly a reference scan is carried out of a navigator image of a region to be examined. The reference navigator image RB recorded in the process is used as a reference image for subsequent navigator images recorded during imaging. The reference navigator image can optionally be scanned much before the further acquisition process. In general it is therefore even possible to re-use a reference navigator image from a scan carried out previously. In this case the reference navigator image can optionally also be read from a data medium, whereby acquisition is omitted. During the further course of the method, navigator image data NV and image volume data BV are recorded simultaneously in a field of view in step 14.II. The navigator image data NV is compared in step 14.III with the reference image data RB and a difference in position AP is ascertained by which the region to be examined has shifted. In step 14.IV the field of view FoV is then corrected, i.e. shifted, by exactly this difference in position so imaging is then continued at exactly the correct position. It is ascertained in step 14.V whether the image recording time $t_{bg}$ has already elapsed. If this is not yet the case, and this is identified in FIG. 14 by "y", the process returns to step 14.II and image recording continues with simultaneous navigator image recording. Steps 14.III to 14.V are then carried out again. If it was ascertained in step 14.V that the image recording time $t_{bg}$ has elapsed, and this is identified in FIG. 14 by "n", an image or an image sequence of the region to be examined is output in step 14.VI.

A delay in the calculation of a difference in position is also possible in step 14.III. In other words, the sequence specifies the exact timing, whereby the difference in position is potentially present in step 14.IV in a form that has not yet been updated. In this case, for example, the last available difference in position is used.

Figure 15:
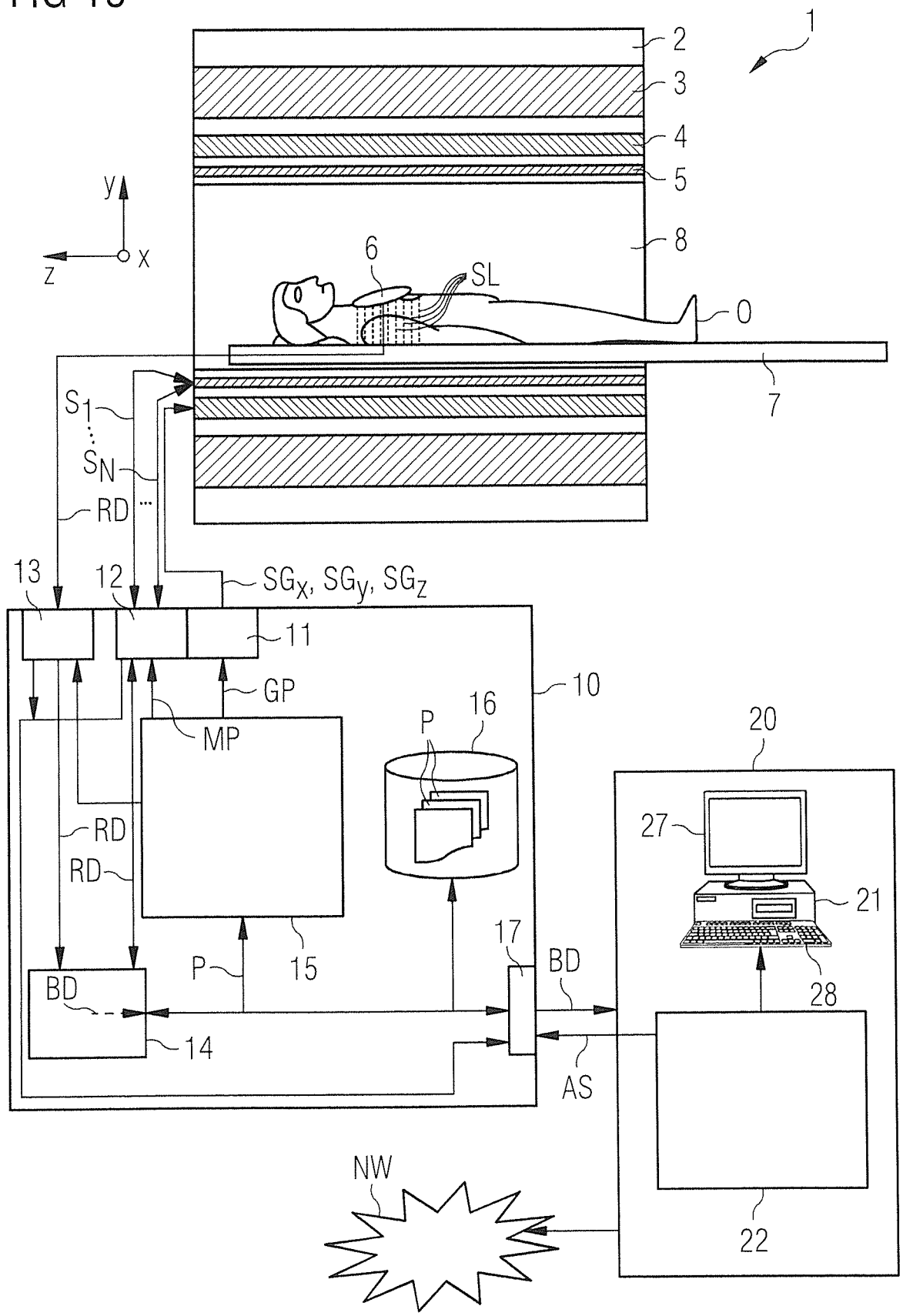
FIG. 15 shows a magnetic resonance imaging apparatus according to an exemplary embodiment of the invention.

FIG. 15 shows a block diagram of an inventive magnetic resonance imaging apparatus 1. This includes the actual magnetic resonance scanner 2 having a scanning space 8 or patient tunnel located therein. A couch 7 can be moved into this patient tunnel 8, so an examination object O (for example a patient/test person or a material to be examined) lying thereon can be supported during an examination at a specific position inside the magnetic resonance scanner 2 relative to the magnet system and the radio-frequency system arranged therein, or can be moved between various positions during a scan.

Basic components of the magnetic resonance scanner 2 are a basic field magnet 3, a gradient system 4 having gradient coils to apply any desired magnetic field gradients in the x, y and z directions, and a radio-frequency body coil 5.

Alternatively or additionally, local transmitting coils can also be used for excitation of magnetic resonance signals, as is the case, for example, with knee imaging.

Magnetic resonance signals induced in the examination object O can be received by the body coil 5 with which, as a rule, the radio-frequency signals are also emitted for inducing the magnetic resonance signals. These signals are conventionally received, however, with local coils 6 placed, for example, on or under the examination object O. All of these components are basically known to a person skilled in the art and are therefore shown only in crudely schematic form in FIG. 5.

The body coil 5 can have a number of N individual antenna rods, for example, in the form of what is known as a birdcage antenna, which can be controlled separately by a control computer 10 as individual transmitting channels S1, . . . , SN, i.e. the magnetic resonance tomography system 1 is a pTX-enabled system. Explicit reference is made, however, to the fact that the inventive method can also be applied to conventional magnetic resonance tomographs having just one transmitting channel.

The control computer 10 can be composed of a large number of stand-alone computers—optionally also spatially separate and connected to each other by suitable bus systems or cable or the like. This control computer 10 is connected by a terminal interface 17 to a terminal 20 via which an operator can control the entire apparatus 1. In the present case this terminal 20 has a computer 21 having a keyboard 28, one or more screen(s) 27 and further input devices, such as, for example, a mouse or the like, so the operator has a graphic user interface available.

The control computer 10 has, inter alia, a gradient controller 11 which can, in turn, be composed of multiple sub-components. The individual gradient coils are connected to control signals SGx, SGy, SGz by way of this gradient controller 11. These are gradient pulses that are set during a scan at exactly specified positions in time and with a precisely predefined course over time in order to scan the examination object O and associated k-space preferably in individual slices SL according to a control sequence AS.

The control computer 10 also has a radio-frequency transceiver unit 12. This RF transceiver unit 12 also has a number of sub-components to emit radio-frequency pulses in each case separately and simultaneously on the individual transmitting channels S1, . . . , SN, i.e. in this case on the individually controllable antenna rods of the body coil 5. Magnetic resonance signals can also be received by the transceiver unit 12. In this exemplary embodiment this occurs with the use of the local coils 6, however. The raw data RD received with these local coils 6 is read out and processed by an RF receiving unit 13. The magnetic resonance signals received therefrom or from the body coil 5 by means of the RF transceiver unit 12 are transferred as raw data RD to a reconstruction unit 14, which reconstructs the image data BD therefrom and stores the data in a storage device 16 and/or transfers it to the terminal 20 via the interface 17, so the operator can look at it. The image data BD can also be stored and/or employed and evaluated at different locations over a network NW. If the local coils 6 have a suitable switchover unit they can also be connected to an RF transceiver unit 12 in order to also use the local coils for transmitting, in particular in pTX mode.

The gradient controller 11, RF transceiver unit 12 and receiving unit 13 for the local coils 6 are each controlled in a coordinated manner by a scan control unit 15. By way of appropriate commands this ensures that a desired gradient pulse train GP is emitted by suitable gradient control signals SGx, SGy, SGz, and simultaneously controls the RF transceiver unit 12 such that a multi-channel pulse train MP is emitted, i.e. that the appropriate radio-frequency pulses are simultaneously given to the individual transmitting rods of the body coil 5 on the individual transmitting channels S1, . . . SN. In addition, it must be ensured that at an appropriate time the magnetic resonance signals at the local coils 6 are read out and processed further by the RF receiving unit 13, or possible signals at the body coil 5 are read out and processed further by the RF transceiver unit 12. The scan control unit 15 predefines the corresponding signals, in particular the multi-channel pulse train MP at the radio-frequency transceiver unit 12 and the gradient pulse train GP at the gradient-control unit 11, according to a predefined control protocol P. All control data which has to be set according to a predefined control sequence AS during a scan is stored in this control protocol P.

A large number of control protocols P for different scans is conventionally stored in a storage device 16. These could be chosen by the operator by way of the terminal 20 and optionally be varied in order to then have an appropriate control protocol P available for the currently desired scan with which the scan control unit 15 can work. Furthermore, the operator can also retrieve control protocols P, for example from a manufacturer of the magnetic resonance system, over a network NW, and then optionally modify and use them.

The underlying progress of a magnetic resonance scan of this kind and said components for control are known to those skilled in the art, so they need not be discussed in further detail herein. Furthermore, a magnetic resonance scanner 2 of this kind and the associated controller can also have a large number of further components that are not illustrated in detail herein. The magnetic resonance scanner 2 can also have a different construction, for example with a patient space open at the side. The radio-frequency body coil does not have to be constructed as a birdcage antenna.

FIG. 15 also schematically illustrates an inventive control sequence-determining computer 22 that is used for determining a magnetic resonance system control sequence AS. For a specific scan this magnetic resonance system control sequence AS contains, inter alia, a pulse sequence having a pulse train GP in order to proceed through a specific trajectory in k-space, and a radio-frequency pulse train coordinated therewith, here a multi-channel pulse train MP, for controlling the individual transmitting channels 1, . . . SN. In the present case the magnetic resonance system control sequence AS is created on the basis of parameters PD predefined in the scan protocol P, in particular according to a method described in respect of FIG. 3 to FIG. 9. The control sequence-determining computer 22 can, as shown, be incorporated in the magnetic resonance apparatus 1 and, in particular, can be a component of the control computer 10. However, it is also conceivable for the control sequence-determining computer 22 to exist externally as an independent unit and to be designed for use with a number of different magnetic resonance systems.

As described above, it is apparent that the invention provides effective possibilities for improving a method for controlling a magnetic resonance imaging system for generating magnetic resonance image data in respect of speed, flexibility and image quality.

The features of all exemplary embodiments or developments disclosed in the figures can be used in any desired combination.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for acquiring magnetic resonance data, comprising:
    operating a magnetic resonance data acquisition scanner, while an object is situated therein, to execute data acquisition scan of the object;
    in said data acquisition scan, operating the magnetic resonance data acquisition scanner to excite a plurality of transverse magnetizations in at least one sub-volume of a navigator volume within said field of view and in at least one sub-volume of an image volume within said field of view, with said transverse magnetizations being excited as different transverse magnetizations that respectively differ from each other and being simultaneously present in at least one period of said data acquisition scan, and thereby acquiring navigator data and raw magnetic resonance data from said field of view of said object;
    providing said navigator data and said raw magnetic resonance data to a processor and, in said processor, using said navigator data to identify a position of said at least one sub-volume of said image volume; and
    in said processor, generating an electronic signal designating said position of said at least one sub-volume of said image volume and making said electronic signal available from said processor as an output.

2. A method as claimed in claim 1 comprising from said processor, operating said magnetic resonance data acquisition scanner to implement a real-time position correction of said field of view using said electronic signal.

3. A method as claimed in claim 1 comprising providing said electronic signal to an image reconstruction computer and, in said image reconstruction computer, implementing a retrospective position correction of said raw magnetic resonance data when executing a reconstruction algorithm to reconstruct image data from said raw magnetic resonance data.

4. A method as claimed in claim 1 comprising operating said magnetic resonance data acquisition scanner to execute said data acquisition scan by exciting said plurality of transverse magnetizations in a number of sub-volumes of said navigator volume that is less than a number of sub-volumes of said image volume, and thereby acquiring said navigator data faster than acquiring said raw magnetic resonance data.

5. A method as claimed in claim 4 wherein said magnetic resonance data acquisition scanner comprises a plurality of N radio-frequency (RF) coils, and wherein said method comprises:
    operating said magnetic resonance data acquisition scanner in said data acquisition scan to acquire said navigator data and said magnetic resonance raw data with each of said plurality of N RF coils;
    prior to operating said magnetic resonance data acquisition scanner to execute said data acquisition scan, operating said magnetic resonance data acquisition scanner wherein reference data are acquired from the object in said field of view respectively by said plurality of N RF coils;
    in said processor, calculating respective convolution matrices for at least some of the simultaneously present transverse magnetizations of said at least one sub-volume of said navigator volume and said at least one sub-volume of said image volume; and
    calculating different convolution matrices, among said convolution matrices, for respectively different spacings of said at least one sub-volume of said navigator volume and said at least one sub-volume of said image volume.

6. A method as claimed in claim 5 comprising, in said processor, adjusting calculation of said convolution matrices to calculate individual convolution kernels for at least some permutations of at least one of target contrasts and sequences of said at least one sub-volume of said navigator volume and said at least one sub-volume of said image volume.

7. A method as claimed in claim 1 comprising operating said magnetic resonance data acquisition scanner in said data acquisition scan to acquire said navigator data from said at least one sub-volume of said navigator volume with a higher acceleration factor than acquiring said raw magnetic resonance data from said at least one sub-volume of said image volume, and thereby acquiring said navigator data faster than acquiring said raw magnetic resonance data.

8. A method as claimed in claim 7 wherein said magnetic resonance data acquisition scanner comprises a plurality of N radio-frequency (RF) coils, and wherein said method comprises:
operating said magnetic resonance data acquisition scanner in said data acquisition scan to acquire said navigator data and said magnetic resonance raw data with each of said plurality of N RF coils;
prior to operating said magnetic resonance data acquisition scanner to execute said data acquisition scan, operating said magnetic resonance data acquisition scanner wherein reference data are acquired from the object in said field of view respectively by said plurality of N RF coils;
in said processor, calculating respective convolution matrices for at least some of the simultaneously present transverse magnetizations of said at least one sub-volume of said navigator volume and said at least one sub-volume of said image volume; and
calculating different convolution matrices, among said convolution matrices, for respectively different spacings of said at least one sub-volume of said navigator volume and said at least one sub-volume of said image volume.

9. A method as claimed in claim 8 comprising, in said processor, adjusting calculation of said convolution matrices to calculate individual convolution kernels for at least some permutations of at least one of target contrasts and sequences of said at least one sub-volume of said navigator volume and said at least one sub-volume of said image volume.

10. A method as claimed in claim 1 wherein said navigator volume and an image volume have a spatial relationship selected from the group consisting of said navigator volume and said image volume at least partially overlap, said image volume comprises an entirety of said navigator volume, and said navigator volume is positioned along a slice in a normal direction on a side outside of said image volume, the normal direction being with respect to a plane in which the slice lies.

11. A method as claimed in claim 1 wherein said navigator volume is positioned along a slice in a normal direction on opposite sides of said image volume, the normal direction being with respect to a plane in which the slice lies.

12. A method as claimed in claim 11 wherein one of said sub-volumes of said navigator volume is positioned closer to said image volume, in the normal direction of said slice, than another of said sub-volumes of said image volumes.

13. A method as claimed in claim 1 comprising operating said magnetic resonance data acquisition scanner in said data acquisition scan to acquire more than two sub-volumes of said navigator volume that are individually positioned at respective predetermined positions along a slice in a normal direction of said image volume, the normal direction being with respect to a plane in which the slice lies.

14. A method as claimed in claim 13 wherein one of said sub-volumes of said navigator volume is positioned closer to said image volume, in the normal direction of said slice, than another of said sub-volumes of said image volumes.

15. A method as claimed in claim 1 comprising:
operating said magnetic resonance data acquisition scanner in said data acquisition scan to execute an excitation process and a subsequent readout process;
in said excitation process, operating said magnetic resonance data acquisition scanner to activate a slice selection gradient in a slice selection direction, that selects said navigator volume and said image volume, and radiating a plurality of radio-frequency excitation pulses that produce said plurality of transverse magnetizations that exist simultaneously in said at least one sub-volume of said navigator volume and in said at least one sub-volume of said image volume and that cause a magnetization of said at least one sub-volume of said navigator volume and said at least one sub-volume of said image volume to differ, influenced by a further imaging parameter that does not relate to either an excitation frequency or an excitation phase; and
in said subsequent readout process, generating at least one readout gradient for the at least one sub-volume of said navigator volume and the at least one sub-volume of said image volume in which said transverse magnetizations exist simultaneously, and receiving radio-frequency signals representing said navigator data and said raw magnetic resonance data respectively from said at least one sub-volume of said navigator volume and said at least one sub-volume of said image volume.

16. A method as claimed in claim 15 comprising selecting said further imaging parameter from the group consisting of an amplitude value of said at least one radio-frequency excitation pulse, an amplitude curve of said at least one radio-frequency excitation pulse, a number of radio-frequency excitation pulses, a starting point and a duration of said at least one radio-frequency excitation pulse, and a sequence type of said data acquisition pulse sequence.

17. A method as claimed in claim 15 comprising multiple further imaging parameters, and selecting said further imaging parameters to be different in order to generate excitations of nuclear spins with different flip angles in said at least one sub-volume of said navigator volume and in said at least one sub-volume of said image volume.

18. A control sequence-determining computer for a magnetic resonance apparatus comprising a magnetic resonance data acquisition scanner, said computer comprising:
a processor configured to generate a pulse sequence comprising an excitation process and a subsequent readout process, to operate said magnetic resonance data acquisition scanner in a data acquisition scan;
said processor being configured to generate said excitation process to operate said magnetic resonance data acquisition scanner by activating a slice selection gradient in a slice selection direction, that selects said navigator volume and said image volume, and by radiating a plurality of radio-frequency excitation pulses that produce said plurality of transverse magnetizations that exist simultaneously in said at least one sub-volume of said navigator volume and in said at least one sub-volume of said image volume and that cause a magnetization of said at least one sub-volume of said navigator volume and said at least one sub-volume of said image volume to differ, influenced by a further imaging parameter that does not relate to either an excitation frequency or an excitation phase;
said processor being configured to generate said subsequent readout process to operate said magnetic resonance data acquisition scanner by activating at least one readout gradient for the at least one sub-volume of said navigator volume and the at least one sub-volume of said image volume in which said transverse magnetizations exist simultaneously, and receiving radio-frequency signals representing said navigator data and said raw magnetic resonance data respectively from said at least one sub-volume of said navigator volume and said at least one sub-volume of said image volume;

an output interface that places said processor in communication with said scanner; and said processor being configured to generate an electronic signal representing said pulse sequence and to provide said pulse sequence to said scanner via said interface.

19. A magnetic resonance imaging apparatus comprising:
a magnetic resonance data acquisition scanner;
a control computer configured to operate said magnetic resonance data acquisition scanner, while an object is situated therein, to execute data acquisition scan of the object;
said control computer being configured to operate the magnetic resonance data acquisition scanner in said data acquisition scan to excite a plurality of transverse magnetizations in at least one sub-volume of a navigator volume within said field of view and in at least one sub-volume of an image volume within said field of view, with said transverse magnetizations being simultaneously present in at least one period of said data acquisition scan, and thereby acquiring navigator data and raw magnetic resonance data from said field of view of said object;
said control computer being configured to use said navigator data to identify a position of said at least one sub-volume of said image volume; and
said control computer being configured to generate an electronic signal designating said position of said at least one sub-volume of said image volume and making said electronic signal available from said control computer as an output, and
wherein said control computer is configured to operate said magnetic resonance data acquisition scanner in the execution of said data acquisition scan to excite said transverse magnetizations as different transverse magnetizations that respectively differ from each other.

20. A magnetic resonance imaging apparatus as claimed in claim 19 wherein said control computer is configured to operate said magnetic resonance data acquisition scanner to implement a real-time position correction of said field of view using said electronic signal.

21. A magnetic resonance imaging apparatus as claimed in claim 19 comprising an image reconstruction computer provided with said electronic signal, said image reconstruction computer being configured to implement a retrospective position correction of said raw magnetic resonance data when executing a reconstruction algorithm to reconstruct image data from said raw magnetic resonance data.

22. A non-transitory, computer-readable data storage medium encoded with programming instructions, said storage medium being loaded into a computer system of a magnetic resonance apparatus that also comprises a magnetic resonance data acquisition scanner, said programming instructions causing said computer system to:
operate the magnetic resonance data acquisition scanner, while an object is situated therein, to execute data acquisition scan of the object;
in said data acquisition scan, operate the magnetic resonance data acquisition scanner to excite a plurality of transverse magnetizations in at least one sub-volume of a navigator volume within said field of view and in at least one sub-volume of an image volume within said field of view, with said transverse magnetizations being simultaneously present in at least one period of said data acquisition scan, and thereby acquiring navigator data and raw magnetic resonance data from said field of view of said object;
use said navigator data to identify a position of said at least one sub-volume of said image volume; and
generate an electronic signal designating said position of said at least one sub-volume of said image volume and making said electronic signal available as an output, and
wherein said programing instructions cause said computer system to operate said magnetic resonance data acquisition scanner in the execution of said data acquisition scan to excite said transverse magnetizations as different transverse magnetizations that respectively differ from each other.

23. A storage medium as claimed in claim 22 wherein said programing instructions cause said computer system to operate said magnetic resonance data acquisition scanner to implement a real-time position correction of said field of view using said electronic signal.

24. A storage medium as claimed in claim 22 wherein said programing instructions cause said computer system to implement a retrospective position correction of said raw magnetic resonance data when executing a reconstruction algorithm to reconstruct image data from said raw magnetic resonance data.

* * * * *